(12) United States Patent
Ahmed et al.

(10) Patent No.: US 11,808,626 B2
(45) Date of Patent: Nov. 7, 2023

(54) SENSOR AND METHOD FOR DISCRIMINATING BETWEEN WAVELENGTH REGIONS USING THE SENSOR

(71) Applicant: Royal Melbourne Institute of Technology, Melbourne (AU)

(72) Inventors: Taimur Ahmed, Coburg (AU); Sumeet Walia, Docklands (AU); Madhu Bhaskaran, Docklands (AU); Sharath Sriram, Docklands (AU)

(73) Assignee: Royal Melbourne Institute of Technology, Melbourne (AU)

( * ) Notice: Subject to any disclaimer, the term of this patent is extended or adjusted under 35 U.S.C. 154(b) by 0 days.

(21) Appl. No.: 17/254,670

(22) PCT Filed: Jun. 26, 2019

(86) PCT No.: PCT/AU2019/050662
§ 371 (c)(1),
(2) Date: Dec. 21, 2020

(87) PCT Pub. No.: WO2020/000037
PCT Pub. Date: Jan. 2, 2020

(65) Prior Publication Data
US 2021/0223097 A1   Jul. 22, 2021

(30) Foreign Application Priority Data
Jun. 26, 2018   (AU) .................................. 2018902291

(51) Int. Cl.
*G01J 1/42* (2006.01)
*H01L 31/0264* (2006.01)
(Continued)

(52) U.S. Cl.
CPC .......... *G01J 1/429* (2013.01); *H01L 31/0264* (2013.01); *H01L 31/0392* (2013.01);
(Continued)

(58) Field of Classification Search
CPC .. G01J 1/429; G01J 2001/4266; G01J 1/0492; G01J 1/4204; G01J 2003/2816;
(Continued)

(56) References Cited

U.S. PATENT DOCUMENTS 9,976,952 B2 *   5/2018   Sriram ................ H01L 31/1032
11,072,855 B2 *   7/2021   Taha .................... C23C 14/5806
(Continued)

FOREIGN PATENT DOCUMENTS

CN       105742394 A     7/2016
WO   WO 2017/035589 A1   3/2017

OTHER PUBLICATIONS

PCT/AU2019/050662, Jul. 24, 2019, International Search Report and Written Opinion.
(Continued)

*Primary Examiner* — David P Porta
*Assistant Examiner* — Djura Malevic
(74) *Attorney, Agent, or Firm* — Wolf, Greenfield & Sacks, P.C.

(57) ABSTRACT

A sensor for discriminating between wavelength regions in an electromagnetic spectrum is disclosed. The sensor comprising a substrate, a sensing element supported on a surface of the substrate, and at least one pair of terminal electrodes disposed on the substrate surface in mutually spaced apart and opposing relation, and in electrical contact with the sensing element, wherein the sensing element is responsive to electromagnetic radiation to yield a change in photocurrent measured between the terminal electrodes as a function of an intensity of the electromagnetic radiation impinging (Continued)

thereon, wherein a positive dependency on the intensity corresponds to a first wavelength region and a negative dependency on the intensity corresponds to a second wavelength region.

15 Claims, 15 Drawing Sheets

(51) Int. Cl.
*H01L 31/0392* (2006.01)
*H01L 31/09* (2006.01)
*H01L 31/18* (2006.01)

(52) U.S. Cl.
CPC .............. *H01L 31/09* (2013.01); *H01L 31/18* (2013.01); *G01J 2001/4266* (2013.01)

(58) Field of Classification Search
CPC . H01L 31/0264; H01L 31/0392; H01L 31/09; H01L 31/18; H01L 31/032; H01L 31/1013
See application file for complete search history.

(56) References Cited

U.S. PATENT DOCUMENTS

| | | | | |
|---|---|---|---|---|
| 2012/0136227 | A1* | 5/2012 | McKenna | A61B 5/0075 600/324 |
| 2013/0075702 | A1* | 3/2013 | Spanier | H01L 31/035227 257/29 |
| 2015/0129747 | A1* | 5/2015 | Petilli | H01L 27/14621 257/432 |
| 2015/0372159 | A1* | 12/2015 | Englund | G01J 3/12 250/206 |
| 2016/0169824 | A1* | 6/2016 | Shin | G01N 27/12 73/31.06 |
| 2017/0350817 | A1* | 12/2017 | Sriram | H01L 31/1032 |
| 2018/0138039 | A1 | 5/2018 | Kwon et al. | |
| 2019/0040526 | A1* | 2/2019 | Taha | C23C 14/3485 |

OTHER PUBLICATIONS

International Search Report and Written Opinion for International Application No. PCT/AU2019/050662, dated Jul. 24, 2019.
Chen et al., Nanostructured photodetectors: from ultraviolet to terahertz. Advanced Materials. Jan. 2016;28(3):403-33.
Journot et al., Self-assembled UV photodetector made by direct epitaxial GaN growth on graphene. ACS Applied Materials & Interfaces. May 10, 2018;10(22):18857-62.
Monroy et al., Wide-bandgap semiconductor ultraviolet photodetectors. Semiconductor Science and Technology. Mar. 3, 2003;18(4):R33-51.
Wu et al., Colossal ultraviolet photoresponsivity of few-layer black phosphorus. ACS Nano. Aug. 25, 2015;9(8):8070-7.
Yuan et al., Polarization-sensitive broadband photodetector using a black phosphorus vertical p-n junction. Nature Nanotechnology. Aug. 2015;10(8):707-13.
Zhu et al., Flexible black phosphorus ambipolar transistors, circuits and AM demodulator. Nano Letters. Mar. 11, 2015;15(3):1883-90.
Extended European Search Report for European Application No. 19827313.8, dated Mar. 15, 2022.
Miao et al., Photothermal effect induced negative photoconductivity and high responsivity in flexible black phosphorus transistors. ACS Nano. Jun. 27, 2017;11(6):6048-56.

* cited by examiner

SENSOR AND METHOD FOR DISCRIMINATING BETWEEN WAVELENGTH REGIONS USING THE SENSOR

RELATED APPLICATIONS

This application is a National Stage filing under 35 U.S.C. § 371 of International application serial no. PCT/AU2019/050662, filed Jun. 26, 2019, titled "Sensor And Method For Discriminating Between Wavelength Regions Using The Sensor", which claims the benefit of Australian application number 2018902291, filed Jun. 26, 2018, the entire contents of each of which are incorporated herein by reference.

TECHNICAL FIELD

The present invention relates to a sensor and a method for discriminating between wavelength regions in an electromagnetic spectrum using said sensor.

The invention has been developed primarily for use in discriminating between wavelength regions associated with the UV-A and UV-B components of sunlight, and will be described hereinafter with reference to this application.

The following discussion of the background to the invention is intended to facilitate an understanding of the invention. However, it should be appreciated that the discussion is not an acknowledgement or admission that any of the material referred to below, and anywhere else in the specification, was published, known or part of the common general knowledge in Australia or any other country as at the priority date of any one of the claims of this specification.

BACKGROUND OF INVENTION

Light waves from the sun which reach the earth are divided into infrared rays, visible light rays and UV rays on the basis of the region of the wavelength. In terms of total energy released from the sun, infrared rays comprise 42%, visible light rays comprise 52% and UV rays comprise 6%. However, in terms of the energy of the light, as compared to infrared and visible light rays, UV rays have the larger effect on living organisms.

In terms of biological effects, UV rays may be categorized into three different types: long wavelength UV rays (UV-A: 315 nm to 400 nm), medium wavelength UV rays (UV-B: 280 nm to 315 nm) and short wavelength UV rays (UV-C: 190 nm to 280 nm).

Atmospheric ozone blocks UV-C and also absorbs a large portion of UV-B. Terrestrial UV light contains approximately 6% of UV-B which causes 80% of harmful effects on humans such as skin cancer, while the remaining 94% of UV-A contributes to the other 20% effects such as retinal damage and immune modulation.

UV sensors have recently been marketed as a means to conveniently measure the presence or absence and intensity of UV. Conventional UV discriminating sensors utilize photochromic chemicals (U.S. Pat. Nos. 5,581,090 and 5,387,798) and photochemical systems (U.S. Pat. No. 5,028,792) which qualitatively indicate the exposure to UV radiation by changing the colour of the device. However, quantification of UV exposure with intensity grading of its discrete component i.e., UV-A and UV-B is required for several applications such as determination of sun protection factor to assess epidermal damage.

Other types of UV sensors based on semiconductor materials such as silicon (US Patent 20060038249 A1 and U.S. Pat. No. 8,872,159) and group III-V compounds (for example nitride semiconductors, US Patent 20130099249 A1) utilize photodiode and phototransistors for the detection of light radiation. However, such UV sensors require specific semiconducting substrates and formation of respective junctions via precise doping and multi-layered structures of the semiconducting materials. As such, this increases the manufacturing cost, limits the choice of substrate and incompatibility with the flexible/wearable electronics.

As such, there is an increasing demand for an inexpensive, portable and wearable (preferably flexible) personal UV sensor or dosimeter than can not only detect UV-A and UV-B exposure, but can also quantify the UV-A and UV-B exposure.

The present invention seeks to provide a sensor and a method for discriminating between wavelength regions in an electromagnetic spectrum using said sensor, which will overcome or substantially ameliorate at least some of the deficiencies of the prior art, or to at least provide an alternative.

SUMMARY OF INVENTION

According to a first aspect of the present invention, there is provided a sensor for discriminating between wavelength regions in an electromagnetic spectrum, comprising: a substrate; a sensing element supported on a surface of the substrate; and at least one pair of terminal electrodes disposed on the substrate surface in mutually spaced apart and opposing relation, and in electrical contact with the sensing element, wherein the sensing element is responsive to electromagnetic radiation to yield a change in photocurrent measured between the terminal electrodes as a function of an intensity of the electromagnetic radiation impinging thereon, wherein a positive dependency on the intensity corresponds to a first wavelength region and a negative dependency on the intensity corresponds to a second wavelength region.

In one embodiment, the first wavelength region corresponds to wavelengths that fall within a range of 315 nm to 400 nm, and the second wavelength region corresponds to wavelengths that fall within a range of 280 nm to 315 nm.

Preferably, the sensing element comprises at least one black phosphorus flake.

In one embodiment, the black phosphorus flake has a bandgap greater than 0.2 electron volts.

In one embodiment, the black phosphorus flake has a thickness that is greater than about 3 nm.

In one embodiment, the black phosphorus flake has a lateral dimension that is greater than about 1 μm.

In one embodiment, the black phosphorus flake comprises a plurality of black phosphorus layers.

In one embodiment, the black phosphorus flake has a responsivity that falls within a range of $4.8 \times 10^4$ A/W to $4.9 \times 10^4$ A/W when subjected to UV-B irradiation at an intensity of 1 mW/cm$^2$.

In one embodiment, the black phosphorus flake has a responsivity that falls within a range of $3.1 \times 10^5$ A/W to $3.2 \times 10^5$ A/W when subjected to UV-B irradiation at an intensity of 0.1 mW/cm$^2$.

In one embodiment, the black phosphorus flake has a responsivity that falls within a range of $1.6 \times 10^4$ A/W to $1.7 \times 10^4$ A/W when subjected to UV-A irradiation at an intensity of 1 mW/cm$^2$.

In one embodiment, the black phosphorus flake has a responsivity that falls within a range of $7.7 \times 10^4$ A/W to $7.8 \times 10^4$ A/W when subjected to UV-A irradiation at an intensity of 0.1 mW/cm$^2$.

In one embodiment, the sensor substrate is an oxide coated silicon substrate.

In one embodiment, the sensor substrate is a polymer substrate.

Suitably, the polymer substrate is manufactured from a polymer selected from the group consisting of poly(ethylene 2,6-naphthalate) (PEN), polyethylene imine (PEI), poly(methyl methacrylate) (PMMA), polyimide (PI), polyethylene terephthalate (PET), and polydimethylsiloxane (PDMS).

According to a second aspect of the present invention, there is provided a method of discriminating between wavelength regions in an electromagnetic spectrum using a sensor, comprising the steps of: subjecting a sensing element supported on a surface of a substrate of the sensor according to the first aspect to electromagnetic radiation; and detecting a change in photocurrent measured between at least one pair of terminal electrodes formed on the sensor substrate and in electrical contact with the sensing element, as a function of an intensity of the electromagnetic radiation impinging on the sensing element, wherein a positive dependency on the intensity corresponds to a first wavelength region and a negative dependency on the intensity corresponds to a second wavelength region.

In one embodiment, the first wavelength region corresponds to wavelengths that fall within a range of 315 nm to 400 nm, and the second wavelength region corresponds to wavelengths that fall within a range of 280 nm to 315 nm.

According to a third aspect of the present invention, there is provided a method of manufacturing a sensor for discriminating between wavelength regions in an electromagnetic spectrum, comprising the steps of: supporting a sensing element on a surface of a substrate; forming at least one pair of terminal electrodes on the substrate surface in mutually spaced apart and opposing relation, and in electrical contact with the sensing element.

Preferably, the sensing element comprises at least one black phosphorus flake.

In one embodiment, the black phosphorus flake has a bandgap greater than 0.2 electron volts.

In one embodiment, the black phosphorus flake has a thickness that is greater than about 3 nm.

In one embodiment, the black phosphorus flake has a lateral dimension that is greater than about 1 µm.

In one embodiment, the black phosphorus flake comprises a plurality of black phosphorus layers.

According to a fourth aspect of the present invention, there is provided a sensing element for use in a sensor for discriminating between wavelength regions in an electromagnetic spectrum, comprising: at least one black phosphorus flake supported on a surface of a substrate, wherein the black phosphorus flake is responsive to electromagnetic radiation to yield a change in photocurrent measured between at least one pair of terminal electrodes disposed on the sensor substrate and in electrical contact with the sensing element, as a function of an intensity of the electromagnetic radiation impinging on the black phosphorus flake, wherein a positive dependency on the intensity corresponds to a first wavelength region and a negative dependency on the intensity corresponds to a second wavelength region.

Other aspects of the invention are also disclosed.

BRIEF DESCRIPTION OF DRAWINGS

Notwithstanding any other forms which may fall within the scope of the present invention, preferred embodiments of the invention will now be described, by way of example only, with reference to the accompanying drawings in which.

DETAILED DESCRIPTION

It is to be understood that the following description is for the purpose of describing particular embodiments only and is not intended to be limiting with respect to the above description.

Since the discovery of graphene, two-dimensional materials (2D) have continued to attract increasing attention owing to their fascinating electrical, optical and mechanical properties. The absence of an intrinsic energy gap in graphene reduces its applicability in electronic and optoelectronic systems. Amongst the family of elemental analogues of graphene, layered black-phosphorus (BP) has emerged as a material of interest owing to its high carrier mobility and the presence of a direct bandgap even in its bulk form. Its thickness dependent bandgap ranges from 0.2 eV for the bulk phase to 1.2 eV for a monolayer.

Without being bound by any one particular theory, the inventors believe that since black phosphorus (BP) possesses strong absorption features in the UV-blue region,[1] and is highly anisotropic, it is expected that BP may find useful application as a photo-detecting material with high responsivity in the UV region.[2-3]

With this in mind, the present invention is predicated on the finding of a sensor (hereinafter referred to as a photo-detector) which utilizes a sensing element in the form few-layer thin black phosphorus (BP) as a semiconducting material for quantitatively discriminating between different wavelength regions in an electromagnetic spectrum. More specifically, the inventors have surprisingly found that the as-fabricated photodetector is capable of discriminating between the wavelength regions associated with the UV-A (315 nm to 400 nm) and UV-B (280 nm to 315 nm) components of sunlight.

Figure 1:
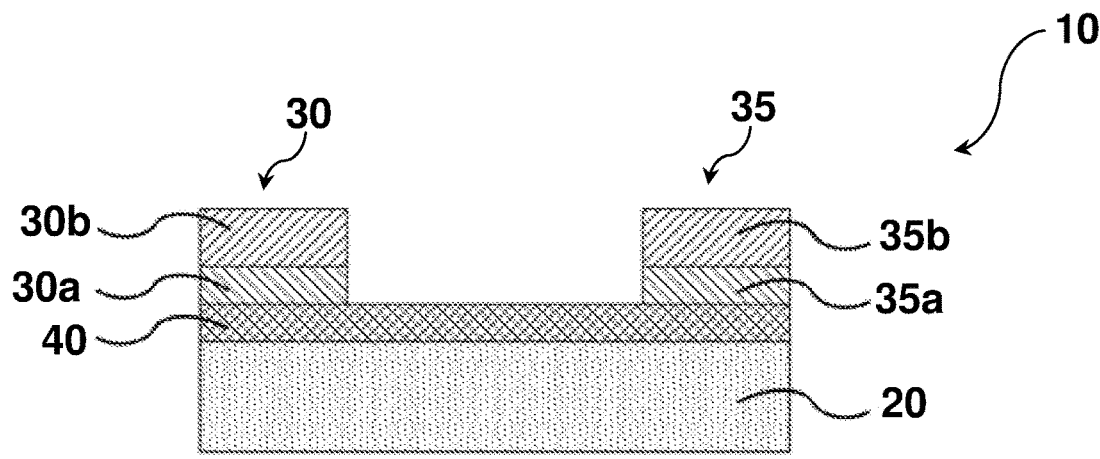
FIG. 1 shows a schematic representation of a photodetector comprising a few layer black phosphorus (BP) sensing element supported on a $SiO_2$/Si substrate, according to a preferred embodiment of the present invention.

FIG. 1 shows a schematic representation of a photodetector 10 for use in discriminating between wavelength regions in an electromagnetic spectrum, according to a preferred embodiment of the present invention.

In its simplest form, the photodetector 10 includes an electrically insulating substrate 20, a pair of terminal electrodes 30, 35 patterned on a surface of the substrate 20 in the Drain-Source configuration (along the armchair direction) in mutually spaced apart and opposing relation, and a sensing element 40 supported on the same surface of the substrate 20, between and in electrical contact with the pair of terminal electrodes 30, 35.

The first terminal electrode 30 takes the form of a drain contact and includes a first layer 30a of metal (such as Cr, Ti, Al) and a second layer 30b of metal (such as Au, Pt, Pd, Ni), each deposited using a suitable metal deposition method.

The second terminal electrode 30 takes the form of a source contact and includes a first layer 35a of metal (such as Cr, Ti, Al) and a second layer 35b of metal (such as Au, Pt, Pd, Ni), each deposited using a suitable metal deposition method.

According to the preferred embodiment, the sensing element 40 takes the form of a few-layer thin black phosphorous (BP) flake that has been mechanically exfoliated by sticking an adhesive tape onto the BP bulk crystal and peeling off a small amount of material. The BP micro-flake produced as a result of the exfoliation is then transferred directly onto the surface of the insulating substrate 20.

The inventors have found that good results can be achieved when the mechanically exfoliated BP micro flake is comprised of one or more layers of black phosphorus, where the resultant BP micro flake has a thickness greater than about 3 nm, and a lateral dimension greater than about 1 µm. The BP micro-flake was found to have a bandgap of greater than 0.2 electron volts.

The substrate 20 used may be manufactured from a material selected from any one or more of the following group of materials consisting of glass, oxide, silicon, ceramic, a polymer.

Figure 2:
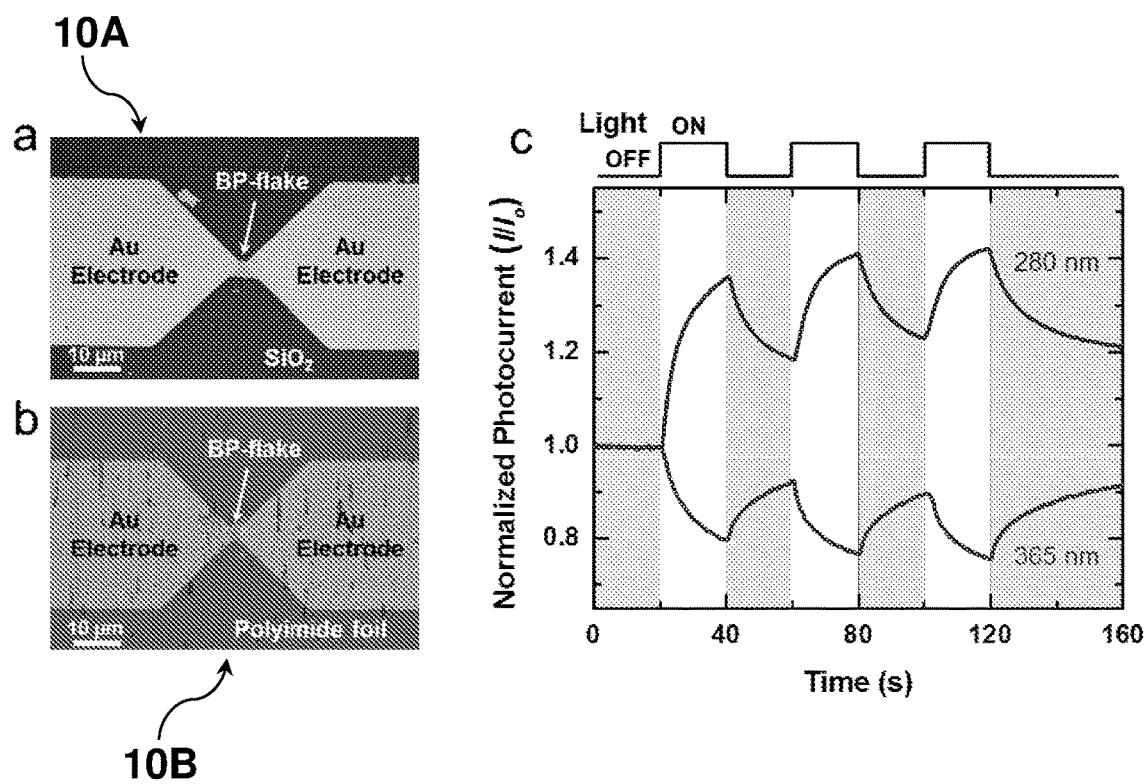
FIG. 2 shows micrographs of (a) the BP photodetector of FIG. 1 ($SiO_2$/Si substrate) and (b) a BP photodetector comprising a few layer black phosphorus sensing element supported on a flexible polyimide (PI) foil substrate; and (c) a plot representing the measured photocurrent ($I/I_o$) obtained when the photodetector of FIG. 1 ($SiO_2$/Si substrate) is exposed over time (s) to UV-B (280 nm) and UV-A (365 nm) illumination wavelengths, each at a power density of 1 mW/$cm^2$.

In one embodiment, and as illustrated in the micrograph in FIG. 2a, the BP photodetector includes a substrate 20 that takes the form of an oxide coated silicon ($SiO_2$/Si) substrate as a semiconducting material. This particular BP photodetector for quantitatively discriminating between different wavelength regions of the electromagnetic spectrum is hereinafter referenced as 10A.

As described in more detail below, the inventors have surprisingly found that the BP photodetector 10 shows a remarkable propensity for quantitatively discriminating between the wavelength regions associated with the UV-A (315 nm to 400 nm) and UV-B (280 nm to 315 nm) components associated with sunlight.

Performance of BP Photodetector 10A

In order to systematically evaluate the performance of the BP photodetector 10A under UV-B (280 nm) and UV-A (365 nm) illuminations, all measurements are carried out through the pair of terminal electrodes 30, 35 that have been patterned on the BP photodetector 10A.

FIG. 2c shows a plot presenting the current vs time characteristics of the fabricated BP photodetector 10A when acquired at a constant DC voltage of 50 mV under individual cycles of UV-B (280 nm) and UV-A (365 nm) illuminations. It is seen that while the current increases on exposure to 280 nm, it shows an opposite (decreasing) trend on being irradiated with 365 nm wavelength. This observation of opposing trends for the UV-B (280 nm) and UV-A (365 nm) shows that the few-layer thin BP based photodetector 10A can discriminate between the two types of UV radiation.

It is observed that the photocurrent exhibits a dependence on the incident power density of the UV-B and UV-A emissions impinging on the BP micro-flake sensing element 40.

Figure 3:
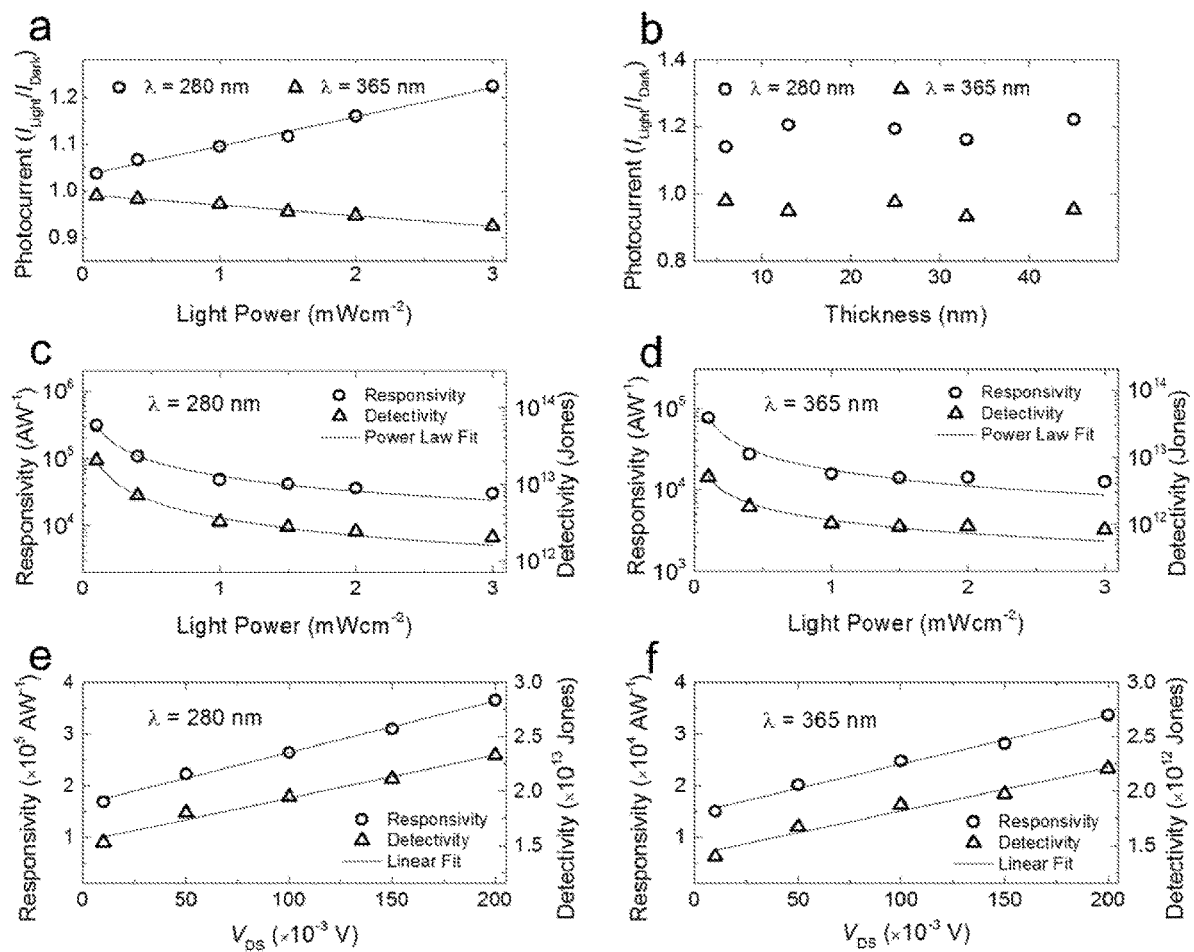
FIG. 3 shows plots of the photoresponse of the BP photodetector of FIG. 1, including: (a) Normalised photocurrent ($I_{Light}/I_{Dark}$) as a function of UV-B and UV-A power densities, ranging from 0.1 mWcm$^{-2}$ to 3 mWcm$^{-2}$, in which the solid lines correspond to the linear fitting of the experimental data for UV-B (open circles) and UV-A (open triangles) illuminations; (b) Normalised photocurrent ($I_{Light}/I_{Dark}$) as a function of BP flake thickness (nm) selected for the BP photodetector; Incident power-dependent responsivity (AW$^{-1}$; open circles) and detectivity (open triangles) for (c) UV-B and (d) UV-A illuminations, in which the solid lines correspond to the power law fitting of the experimental data; Drain-source voltage dependent responsivity ($\times 10^5$ AW$^{-1}$; open circles) and detectivity (open triangles) for (e) UV-B and (f) UV-A illuminations, in which the solid lines correspond to the linear fitting of the experimental data.

For instance, FIG. 3a shows a plot of power-dependent normalised photocurrent ($I_{Light}/I_{Dark}$) as a function of UV-B and UV-A illumination power density ranging from 0.1 mWcm$^{-2}$ to 3 mWcm$^{-2}$. Solid lines correspond to the linear fitting of the experimental data for UV-B (280 nm) illumination (open circles) and UV-A (365 nm) illumination (open triangles).

As shown in FIG. 3a, under UV-B (280 nm) illumination, the photocurrent shows a positive dependence on the power density, which can be attributed to the higher number of photo-generated carriers under ~4.4 eV (280 nm) excitation energy relative to the number of photo-generated carriers under ~3.4 eV (365 nm). While under UV-A (365 nm) illumination, the photocurrent shows a negative dependence on the illumination power density.

FIG. 3b shows a plot of normalised photocurrent ($I_{Light}/I_{Dark}$) as a function of the BP flake thickness (nm) selected for the BP photodetector 10A. It is apparent that under a constant UV-B/UV-A illumination power density, the photocurrent is independent of the thickness of the BP micro-flake across a range of thicknesses ranging from ~5 nm to ~45 nm. This highlights the significant technological relevance that the BP micro-flake sensing element 40 can effectively sense and discriminate UV-B and UV-A irradiation regardless of the crystal thickness.

Furthermore, the performance of the BP photodetector 10A is quantitatively assessed by calculating important figures-of-merit, including responsivity (R), external quantum efficiency (EQE) and specific detectivity (d) for both UV-B and UV-A wavelengths. The responsivity which quantifies the photocurrent generated per unit power of the excitation wavelength on the effective area of the photodetector 10A is calculated by:

$$R = \frac{\Delta I}{P_\lambda S} \quad (1)$$

where ΔI is the difference between the measured currents with ($I_{Light}$) and without ($I_{Dark}$) illumination, $P_\lambda$ is the power density and S is the effective area of the photodetector 10A. The external quantum efficiency defines the number of effective charge carriers generated per incident photon of the excitation wavelength and is calculated by the following equation:

$$EQE = \frac{\Delta I h \nu}{P_\lambda q} \quad (2)$$

where h is Plank's constant, ν is the photon frequency and q is the elemental charge. Furthermore, the specific detectivity describes the smallest detectable signal and is calculated by the following equation:

$$D^* = \frac{\sqrt{SB}}{NEP} \quad (3)$$

$$NEP = \frac{i_n}{R} \quad (4)$$

where B is the electrical bandwidth, NEP is the noise equivalent power and $i_n$ is the noise current. Among the three possible noise sources that may limit D*, namely shot noise from dark current, thermal and Johnson-Nyquist noise. The shot noise from the dark current can be considered as the main contributor here as the short wavelength UV illuminations and low measurement voltages (10-200 mV) are used in our experiments.[4]

As such, Equation 3 can be simplified as:

$$D^* = \frac{\sqrt{S}\,R}{\sqrt{2q I_{Dark}}} \quad (5)$$

FIGS. 3c and 3d present the power-dependent responsivity (AW$^{-1}$) and detectivity under UV-B (280 nm) and UV-A (365 nm) illumination wavelengths, respectively. The observed decrease in responsivity (AW$^{-1}$) and detectivity with increasing power density (mWcm$^{-2}$) for both illumination wavelengths is consistent with that reported for conventional photodetectors.[5-6]

FIGS. 3e and 3f show the Drain-Source bias ($V_{DS}$) dependent responsivity and specific detectivity under UV-B (280 nm) and UV-A (365 nm) illuminations, respectively, at a fixed power density of 0.4 mWcm$^{-2}$.

Regardless of the excitation wavelength, both responsivity and specific detectivity exhibit a linear dependence on the drain to source voltage ($V_{DS}$) which can be associated with increasing carrier drift velocity with increasing bias.[7] Such $V_{DS}$ dependent responsivity is consistent with photodetectors previously reported in the literature.[8-9]

The inventors have found that the BP micro-flake sensing element 40 has a responsivity that falls within a range of 4.8×10$^4$ A/W to 4.9×10$^4$ A/W when subjected to UV-B (280 nm) irradiation at an intensity of 1 mW/cm$^2$, and a responsivity that falls within a range of 3.1×10$^5$ A/W to 3.2×10$^5$ A/W when subjected to UV-B (280 nm) irradiation at an intensity of 0.1 mW/cm$^2$.

In the case of UV-A (365 nm) illumination, the inventors have found that the BP micro-flake sensing element 40 has a responsivity that falls within a range of 1.6×10$^4$ A/W to 1.7×10$^4$ A/W when subjected to UV-A (365 nm) irradiation at an intensity of 1 mW/cm$^2$, and a responsivity that falls within a range of 7.7×10$^4$ A/W to 7.8×10$^4$ A/W when subjected to UV-A (365 nm) irradiation at an intensity of 0.1 mW/cm$^2$.

As disclosed herein, a maximum responsivity of 3.2×10$^5$ AW$^{-1}$ (with corresponding D* of 2.1×10$^{13}$ Jones and EQE of 1.4×10$^6$%) is achieved for the photodetector 10A when illuminated with an illumination wavelength of 280 nm under a power density of 0.1 mWcm$^{-2}$. While a maximum responsivity of 7.8×10$^4$ AW$^{-1}$ (with corresponding D* of 5.1×10$^{12}$ Jones and EQE of 3.4×10$^5$%) is measured for the same photodetector 10A when illuminated with an illumination wavelength of 365 nm under a power density of 0.1 mWcm$^{-2}$.

This observed relatively higher photoresponse (almost an order of magnitude) of the BP photodetector 10A when illuminated with an illumination wavelength of 280 nm as compared to that when the same photodetector 10A is illuminated with an illumination wavelength of 365 nm can be attributed to the higher excitation energy supplied by the higher photon energy associated with the shorter illumination wavelength.

Anisotropic Photoresponse of BP

Figure 4:
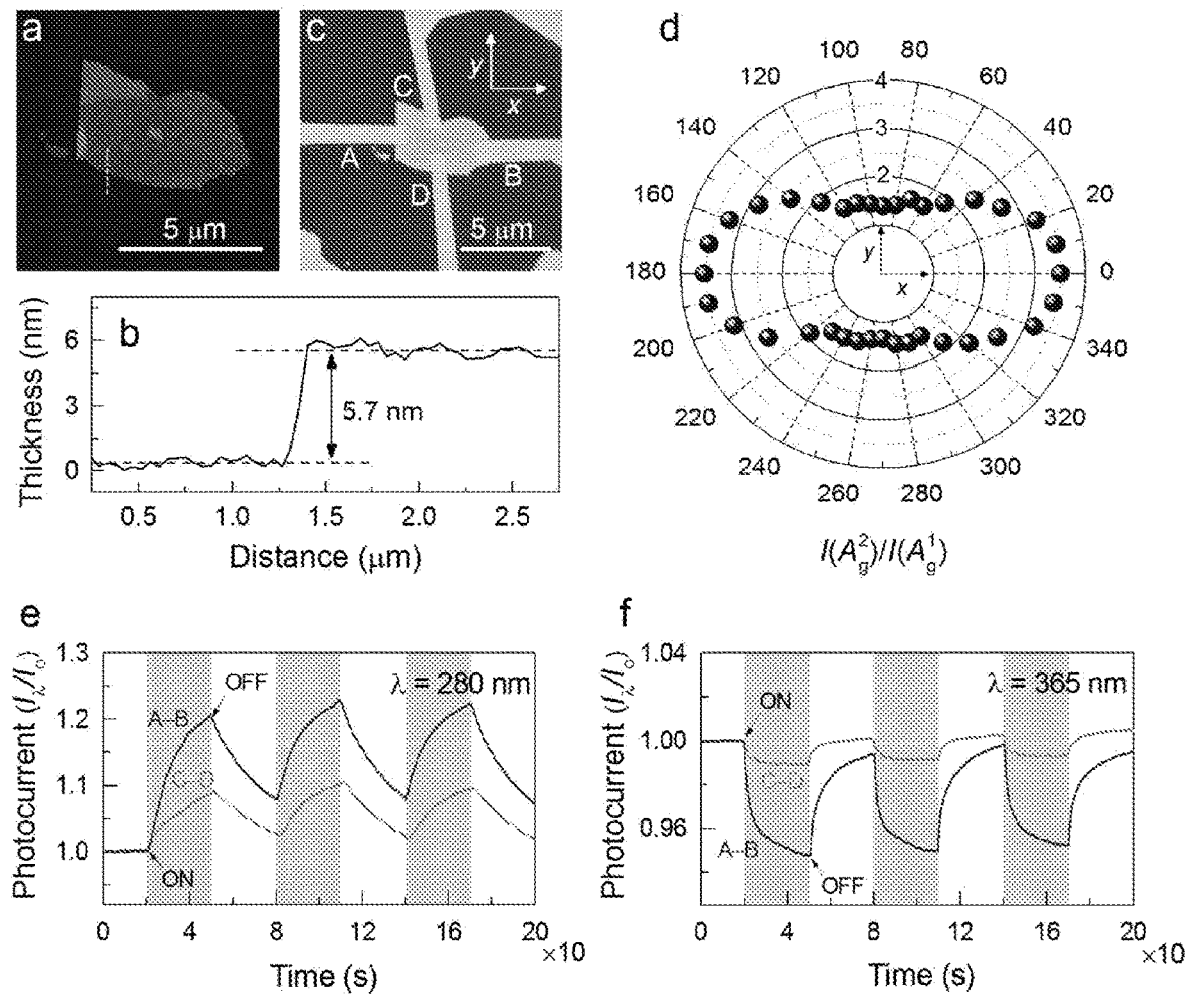
FIG. 4 shows (a) an atomic force microscopy (AFM) topographic scan of the BP flake selected for a representative BP photonic device, (b) a plot showing the height profile of the BP flake measured along a line depicted on the topographic scan in FIG. 4(a), which corresponds to 5.7 nm, (c) an optical microscopy photograph of the representative BP photonic device fabricated on a rigid $SiO_2$/Si substrate, having two sets of drain-source electrode pairs—namely 'AB' and 'CD', fabricated orthogonally to each other and used for photo-electronic characterisation, (d) a plot depicting the ratio of Raman $A_g^2$ and $A_g^1$ peak intensity as a function of excitation laser polarization angles, and plots showing the normalised transient photocurrent between A-B and C-D electrode pairs measured under pulsating (e) UV-B ($\lambda$=280 nm) and (f) UV-A ($\lambda$=365 nm) illuminations at power densities of 2 mWcm$^{-2}$ and a constant DC bias of 50 mV.

In order to characterise the ambipolar optoelectronic properties of few-layer BP, flakes with different thicknesses are selected for fabricating devices (see Materials and Methods section). FIG. 4a shows an atomic force microscope (AFM) topographic scan and height profile (FIG. 4b) of ca. 5.7 nm BP flake (corresponding to 10 layers) selected for a representative device on a SiO$_2$/Si substrate (FIG. 4c). Two pairs of metal electrodes are orthogonally patterned on the selected BP flakes, where an electrode pair (A-B) is patterned along x-direction (armchair) and another electrode pair (C-D) along y-direction (zigzag). Prior to the electrode fabrication, the BP crystal orientation is identified by the polarization-resolved Raman spectroscopy (FIG. 4d), where the ratio of the $A_g^2$ and $A_g^1$ peak intensity is higher (~3.51±0.02) along x-direction than y-direction (~1.35±0.03).

A detailed polarization-resolved Raman analysis of the mechanically exfoliated few-layer black phosphorus (BP) flakes is presented below. Furthermore, the anisotropy of the BP crystal is confirmed by the carrier mobility across the electrode pairs and solving low energy k·p Hamiltonian, as discussed below.

Anisotropic Characterisation of Few-Layer Black Phosphorus

Polarization-Resolved Raman Spectroscopy

The crystal orientation of mechanically exfoliated few-layer black phosphorus (BP) flakes is assessed by polarization-dependent Raman spectroscopy and electric field dependent carrier mobility measurements.

Figure 5:
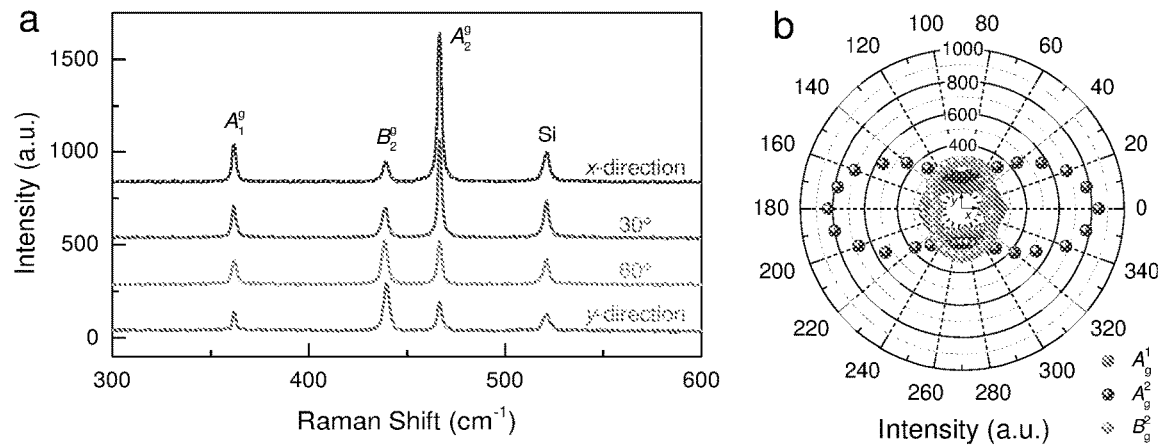
FIG. 5 shows (a) Raman spectra of a BP flake (~5.7 nm) exfoliated on a $SiO_2$/Si substrate with excitation laser polarization aligned at different angles, (b) a plot showing the peak intensities of the $A_g^1$, $A_g^2$ and $B_g^2$ modes plotted as a function of polarization angles.

FIG. 5a shows representative polarization-dependent Raman spectra of a ~5.7 nm thin BP flake with excitation laser polarized aligned at different angles, ranging between 0° (x-direction) and 90° (y-direction).

FIG. 5b shows a polar plot of peak intensities $A_g^1$, $A_g^2$ and $B_g^2$ modes corresponding to polarization angles.

Anisotropic Charge Carrier Transport

Drain current vs. drain voltage characteristics ($I_{DS}$-$V_{DS}$) acquired between the electrode pairs (without gate voltage, $V_{GS}$, FIG. 6a) show higher electrical conductivity between the A-B electrodes than between the C-D electrodes. Furthermore, the field dependent carrier mobility is extracted along both electrode pairs by utilizing the back gate configuration.

Figure 6:
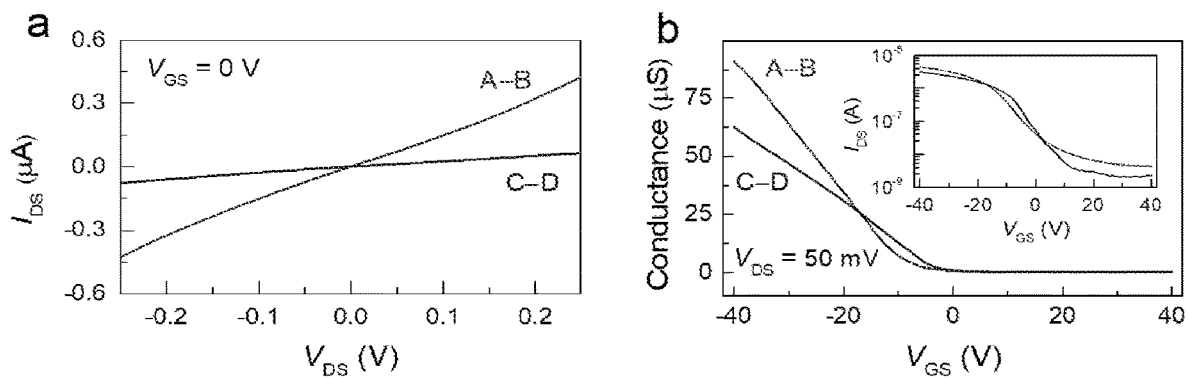
FIG. 6 shows (a) a plot showing the $I_{DS}$ vs. $V_{DS}$ characteristics measured between the A-B and C-D electrode pairs of the representative BP photonic device of FIG. 4 in the dark without gate voltage ($V_{GS}$=0 V), and (b) a plot showing the conductance measurement between both electrode pairs as a function of back-gate bias and at a constant drain-source voltage ($V_{DS}$=50 mV), where the inset image in FIG. 6b shows the transfer characteristics between the A-B and C-D electrode pairs.

FIG. 6b shows conductance and transfer characteristics (inset) along A-B and C-D electrode pairs as a function of gate voltage. The on-off current ratios are exceeding $10^3$ along both electrode pairs. Also field dependent carrier mobilities of ca. 166 cm$^2$V$^{-1}$ s$^{-1}$ and ca. 95 cm$^2$V$^{-1}$ s$^{-1}$ are extracted along A-B and C-D electrode pairs, respectively. Owing to the in-plane anisotropic electrical conductance in BP (with a ratio of 1.5),[10] suggests that A-B electrodes are along the armchair direction and C-D electrodes are along the zigzag direction.

Transient photoresponse of the representative device is acquired in the UV region of the light spectrum and along both electrode pairs at a constant DC bias of 50 mV. FIG. 4e and FIG. 4f show normalised transient photocurrent under the illumination of pulsating UV-B ($\lambda$=280 nm) and UV-A ($\lambda$=365 nm) excitation wavelengths, respectively, along the electrode pairs A-B and C-D. In more than 15 devices studied in this work, it is consistently observed that while the current increases on exposure to 280 nm, it shows an opposite (decreasing) trend on exposure to 365 nm wavelength. The relatively high photocurrent (ca. 11% for 280 nm and ca. 4% for 365 nm) along the A-B electrode pair than the C-D one can be associated with the in-plane optical anisotropy which allows higher absorption of the incident light in the armchair direction and dichroic photocurrent generation.[10-13]

Mechanism of Photoresponse

In 2D systems, negative photoconductivity is typically associated with the bolometric effect?[9, 14-17] However, the unusual negative photocurrent observed in BP under long-wave UV (365 nm) excitation is intrinsically material-related and is associated with the surface adsorbates.[14, 18] It has previously been determined that BP in ambient conditions readily adsorbs oxygen and forms phosphorus oxide species across the crystal surface which can act as charge trap sites.[1, 18-22] These extrinsic trap sites, act as scattering centres under light illumination and reduce the conductance of the device and, hence, are the origin of negative photocurrent. In contrast, J. Wu et al.[8] previously reported positive photocurrent in BP phototransistors under 330 nm and 370 nm excitation wavelengths, operating under a negative gate voltage (−80 V) and high vacuum. The presence of electric field at BP/substrate interface can lead to the accumulation of photogenerated positively charge carriers (holes) at the interface resulting in an increase in photocurrent (between drain and source) on excitation. To gain an in-depth understanding of the origin of negative photocurrent under 365 nm excitation wavelength, a series of experimental characterisations coupled with density-functional theory (DFT) calculations were used (as discussed below).

Ambient oxidation of BP has been analysed in several recently reported DFT investigations,[1, 23-28] where oxygen is predicted to spontaneously dissociate on BP, a process that is facilitated with reduction in the number of BP layers.[29] The adsorption of atomic oxygen is reported to have a negative formation energy ($E_f$),[30] which indicates that the incorporation of oxygen stabilizes some of the phosphorene defects. Of interest to the present work, Ziletti et al.[31] predicted that metastable structures with adsorbed oxygen atoms exhibit localised defect levels. These levels, which are characterised by horizontal discrete levels within the band gap and do not endure significant dispersion, act as charge traps that diminish the conductance of BP under 365 nm illumination. The oxidation of defective BP, which can also be seen as a substitutional doping of BP with oxygen atoms, introduces localised defects in BP.[30] As such, the investigation of oxidized phosphorene was expanded by studying various oxidised structures and the nature of their induced defects. Since the oxygen dissociation reaction on the surface has a low energy barrier and high exothermicity,[25] it is considered that the chemical adsorption of oxygen has occurred on the surface of BP in their simulations.

Oxidation-Related Defect Structures in Phosphorene

DFT Simulations of Defect Structures in Phosphorene

In order to find localised defects, a range of monolayer phosphorene structures with different defect structures were investigated.

Figure 8:
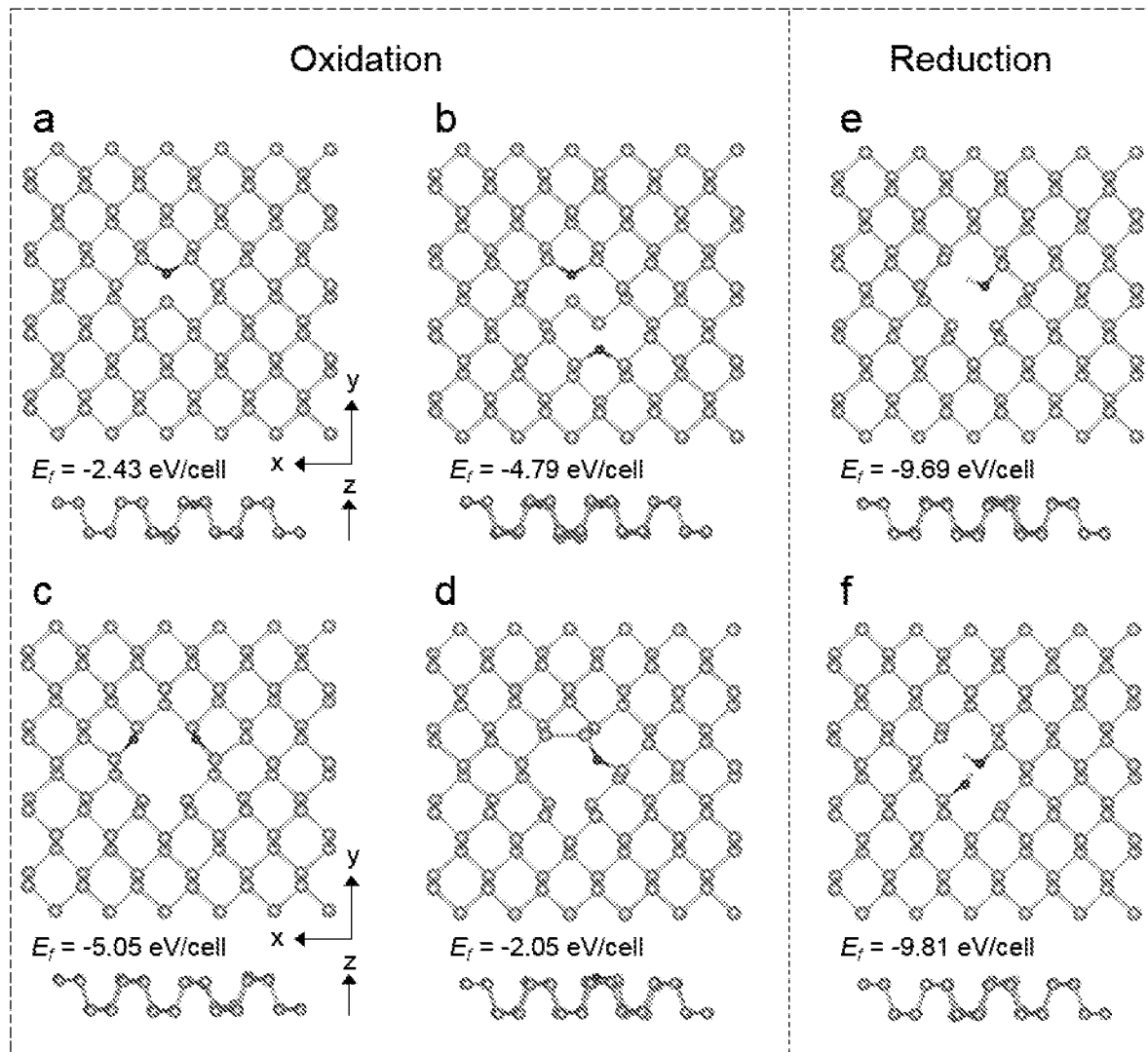
FIG. 8 shows the atomic structure of the four oxidised and two reduced monolayer phosphorene structures, in which (a) one P atom is substituted with an O atom, (b) two P atoms are substituted with two O atoms, (c) four P atoms are replaced by two O atoms, (d) two P atoms are replaced with one O atom, (e) four P atoms are replaced by an OH group, and (f) four P atoms are replaced by two OH groups. Formation energies are labelled for each defect structure.
Figure 9:
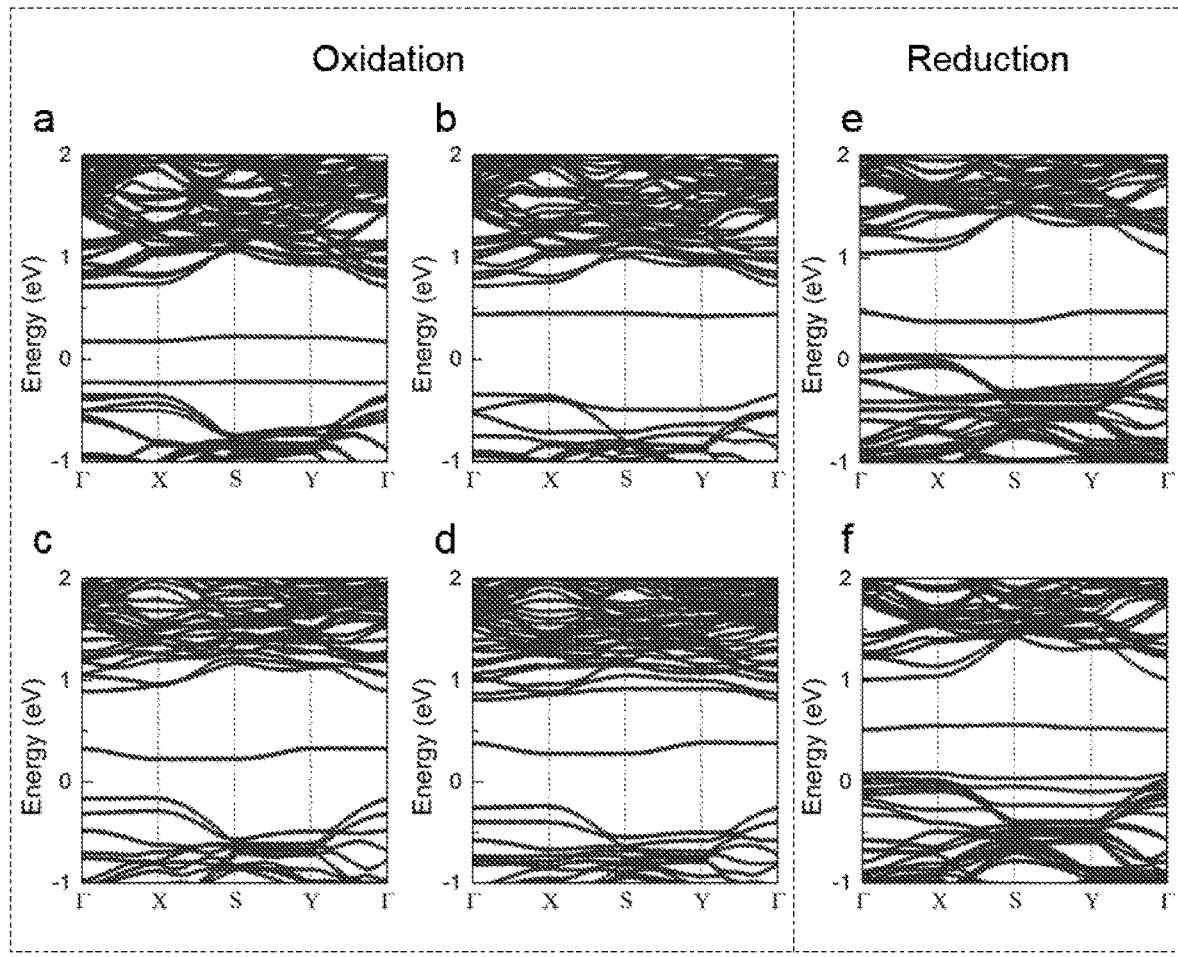
FIG. 9 shows the corresponding band structure of four oxidised and two reduced monolayer phosphorene structures in FIG. 8.

FIG. 8 and FIG. 9 show atomic and band structures of oxidised and reduced phosphorene structures, respectively, along with their formation energies ($E_f$). The monolayer phosphorene structure is constructed from 4×6 replicas of a phosphorene unit cell. Density-functional theory (DFT) calculations are performed to optimize the atomic structures, and then subsequently to calculate the band structures and formation energies of these structures. The formation energy is calculated according to the formula:

$$E_f = E_{Defect+O} - (E_{Defect} + nE_O + mE_H),$$

where $E_{Defect+O}$ is the total energy of the oxidised defective system, $E_{Defect}$ is the total energy of the unoxidized defective phosphorene, n is the number of added O atoms, $E_O$ is half of the total energy of the oxygen molecule, m is the number of added H atoms, and $E_H$ is half of the total energy of the hydrogen molecule. The calculated formation energies are generally negative because oxidation or reduction stabilises the defective structure.

Figure 7:
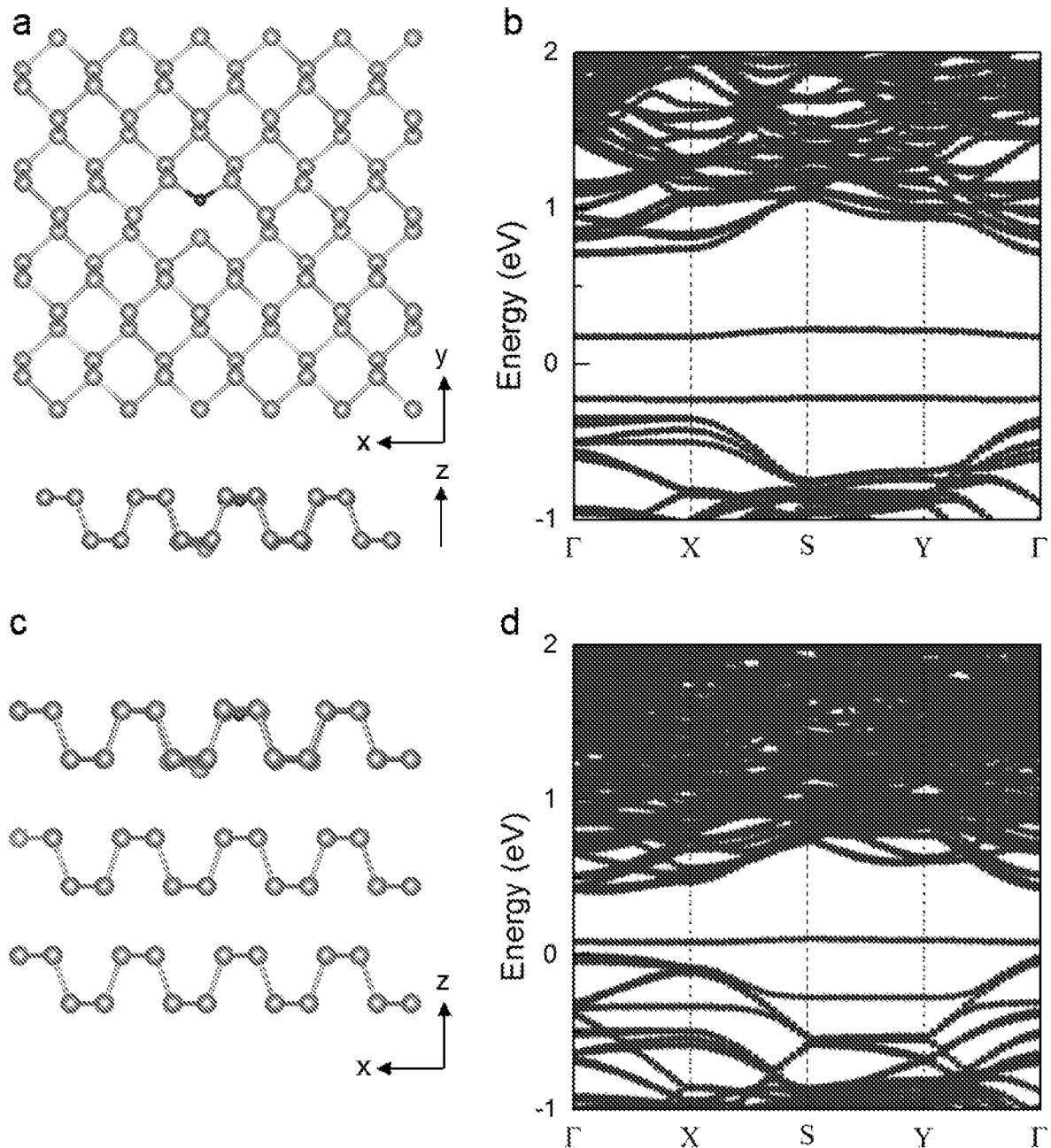
FIG. 7 shows a) the atomic structure of defective phosphorene where one P atom is substituted with an O atom, and where the formation energy is calculated to be −2.43 eV per cell, (b) the band structure of oxidised phosphorene corresponding to the structure in FIG. 7(a), (c) the atomic structure of a trilayer system, where the top layer is the defect structure in FIGS. 7(a), and (d) the band structure of the trilayer structure in FIG. 7(c)

FIG. 7a shows the atomic structure of phosphorene after introducing an oxygen atom into the defective structure. While, FIG. 7c shows an oxidised structure (as in FIG. 7a) stacked on two pristine phosphorene layers to form a trilayer structure. The localisation of a defect level is indicated by the dispersiveness of the defect energy; that is, if the level in the band structure is a straight line, the defect will be spatially localised. The band structure of an oxidised phosphorene structure in FIG. 7b, induced by incorporating an oxygen atom, shows a nearly straight defect level which suggests that it is nearly localised. Furthermore, the defect levels induced in different oxidised structures are also nearly localised. The localisation of the defect in the monolayer (FIG. 7a and FIG. 7b) also persists in the case of the multilayer, as shown in the band structure in FIG. 7d. The presence of localized defect levels in the oxidised structures at such low formation energies explain the observed negative photocurrent under 365 nm illumination: exposure to which causes the formation of oxidised defect structures that harbour localised defect levels and creating charge traps.

On the other hand, exposure to 280 nm wavelength light (having an energy of 4.4 eV, which is very close to the energy required to split an $H_2$ molecule), may give rise to a potential mechanism for the onset of photoconduction via the splitting of $H_2$ and $H_2O$ molecules in ambient, resulting in passivation of oxygen sites in oxidised phosphorene and hence the introduction of carriers, which could subsequently lead to the photoconductivity within the sample. In addition to the H-reduction, the increase in conductivity under high photon energy (>4 eV) excitation wavelengths can also be explained by the ionization of defects.[32-34] However, further theoretical investigation is required to validate the exact mechanism of reactions taking place under high photon energy irradiations, and this is the subject of ongoing work.

The energy-dispersive X-ray spectroscopy (EDS) and electron energy loss spectroscopic (EELS) analysis of the BP flakes show oxidation of as-exfoliated BP flakes and presence of a phosphorus-oxide ($PO_x$) layer on the BP flakes. To assess the microstructure of $PO_x$ layer in these BP devices, cross-sectional lamellae are prepared for transmission electron microscopy (TEM) analysis.

Figure 10:
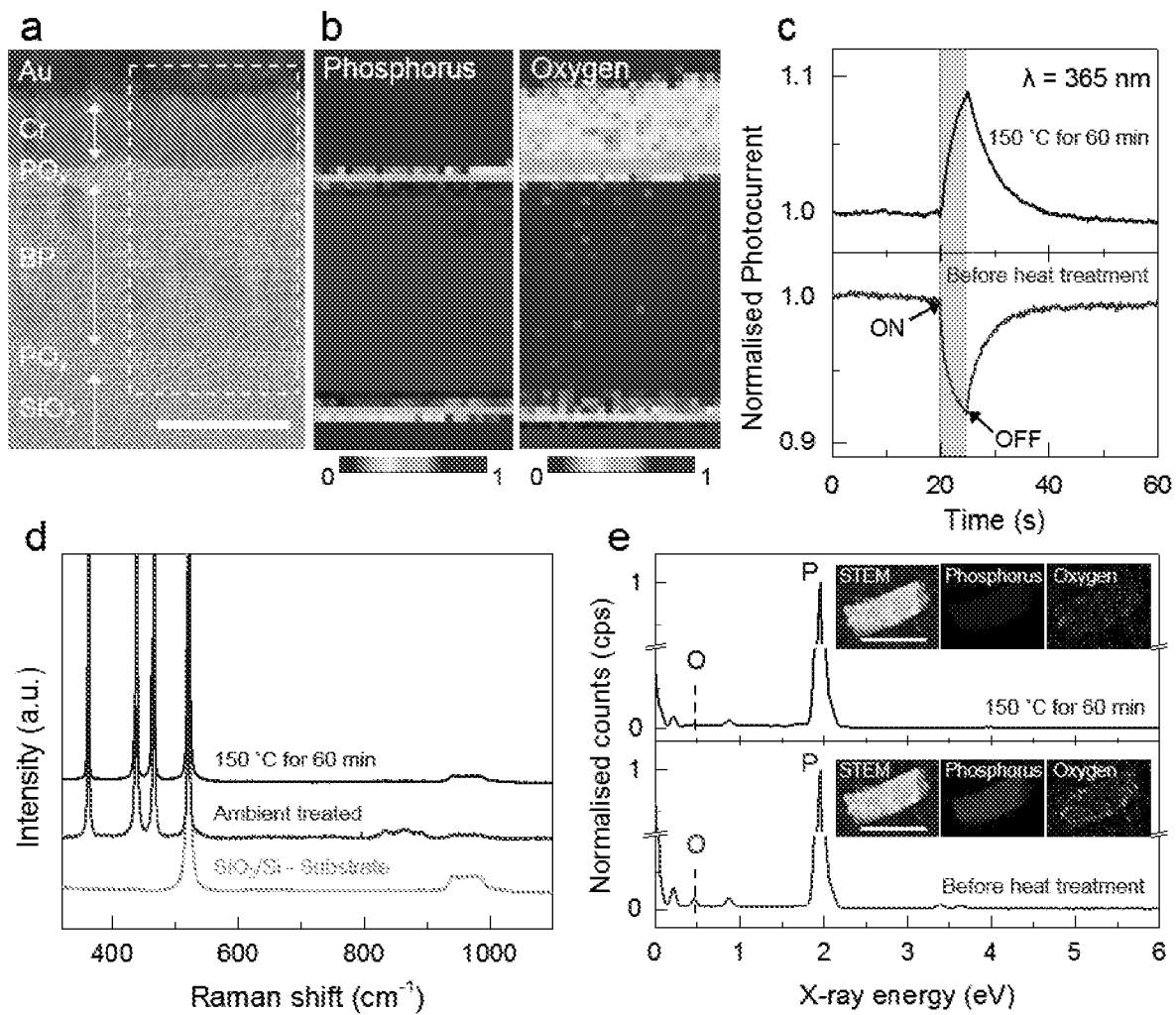
FIG. 10 shows (a) a cross-sectional transmission electron microscope (TEM) micrograph of a representative BP device taken for the region under an Au/Cr electrode, (b) electron energy loss spectroscopy (EELS) area maps generated for a region of interest highlighted in FIG. 10(a) by taking O-K edge and P-L edge intensities of the collected spectra (at each pixel) after pre-edge background subtraction, (c) a normalised photoresponse of a representative BP device under 365 nm illumination measured before and after being subjected to 150° C. for 60 minutes in Ar, where the photocurrents are measured under 4 mW/cm$^2$ and 9 mW/cm$^2$ of power density before and after the thermal treatment, respectively, (d) in-situ Raman spectra of a BP flake subjected to ambient temperature and 150° C. for 60 minutes in Ar, and (e) normalized energy-dispersive X-ray spectroscopy (EDS) spectra collected from a BP flake exfoliated on a TEM grid and exposed to ambient temperature and heat treated at 150° C. for 60 minutes in Ar, where both spectra are normalized with phosphorus peak intensities. Inset show EDS area maps of the BP flake used for EDS analysis. Scale bar corresponds to 3 μm.

FIG. 10a shows a cross-sectional TEM micrograph of a representative BP device with a structure of $Au/Cr/BP/SiO_2/Si$ where Au/Cr layers are patterned as electrical contacts. High-resolution TEM reveals the presence of ~3 nm amorphous layers at the top Cr/BP and bottom $BP/SiO_2$ interfaces. The composition of these amorphous layers is identified by acquiring EELS O-K edge and P-L edge area maps (FIG. 10b) of a region-of-interest (ROI), highlighted by an enclosed area in FIG. 10a. The EELS area maps show oxygen content at the interfacial regions associated to the amorphous layers, indicating the presence of phosphorus oxide at the top and bottom interfaces of the BP device. Furthermore, the presence of oxygen content in the Cr layer can be attributed to the partial oxidation of Cr to chromium oxide during device fabrication.

Thermal Treatment of BP

Thermal treatment of 2D materials, including BP, is known to significantly reduce oxidation-related defects due to the evaporation of surface adsorbates.[35-37] Based on this, it is expected that defect engineering by controlled thermal annealing of defective BP in an inert environment may tune the photoresponse of these devices. As such, a comparison was conducted between the photoresponse and material characteristics of thermally treated BP in an inert Ar environment and ambient exposed untreated BP. FIG. 10c shows that an ambient exposed BP device exhibits negative photocurrent under the illumination of 365 nm, which changes to a positive photocurrent after the device is subjected to 150° C. for 60 min in Ar. This can be associated with the evaporation of surface adsorbates and associated reduction in carrier scattering centres during thermal treatment.[35-36] On the other hand, the devices retain a positive photocurrent profile at 280 nm exposure. In-situ Raman spectra (FIG. 10d) of an ambient exposed flake show relatively small and broad peak in 800-900 cm$^{-1}$ range which is associated with the Raman vibration modes of phosphorus oxide species.[1, 22, 38] The presence of these oxide species is consistent with the cross-sectional transmission electron microscope (TEM) analyses. It is of note that the in-situ Raman spectra of thermally treated BP flakes show significant reduction in the intensity of oxide peaks after annealing in Ar at 150° C. for 60 min. Furthermore, a relative change in the optical absorbance and morphology is observed after the thermal annealing of an ambient exposed BP flake.

FIG. 10e shows a quantitative EDS comparison of a representative BP flake before and after thermal treatment at 150° C. in Ar for 60 min. The normalized X-ray energy spectra and EDS area maps (inset of FIG. 10e) show that annealing in an inert Ar environment reduces oxygen content from 3.1 wt % to 0.9 wt % which is expected to be from the surface of BP flake. However, the presence of residual oxide observed after thermal treatment can be explained by the formation of a stable phase of phosphorus oxide (such as $P_2O_5$) as reported in the literature.[36-39] The above-mentioned DFT simulations and characterizations reveal a vivid picture where localized charge-trap sites induced by the dissociation of surface adsorbates define the conductance of BP based on the illumination energy. In addition, same photoresponse characteristics, i.e., positive photocurrent under 280 nm and negative photoresponse under 365 nm excitation wavelengths, in devices with Cr/Au and Ti/Au electrode junctions further support the discussion that BP is the functional component of photoresponse in these devices.

Figure 11:
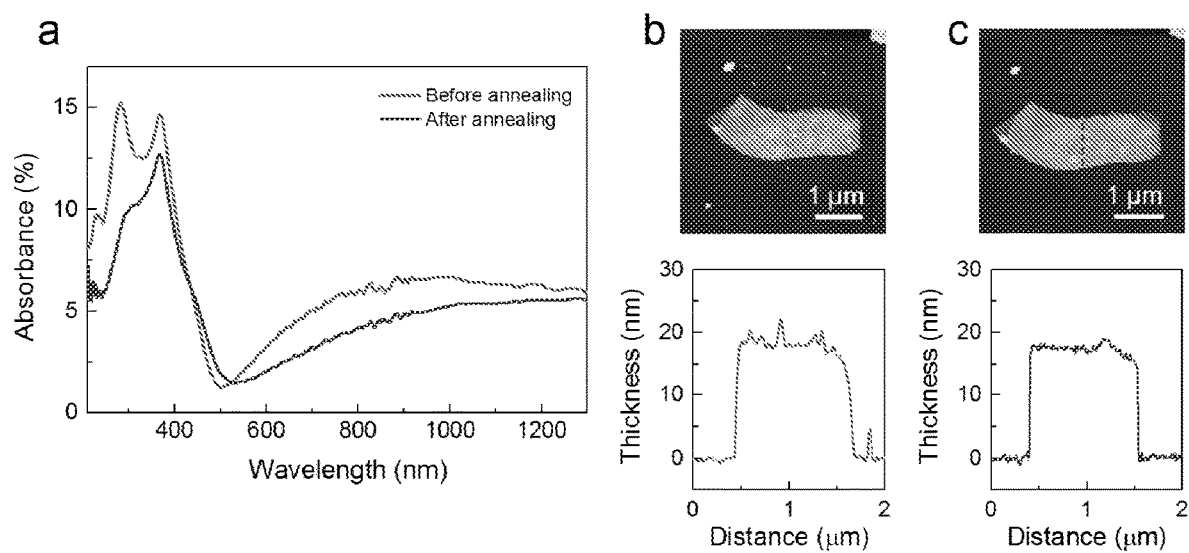
FIG. 11 shows (a) UV-IR optical absorbance spectra of mechanically exfoliated BP measured before (red line profile) and after (blue line profile) thermal annealing in Ar at 150° C. for 1 hour, topographic AFM scans of a representative BP flake (b) taken before and (c) after annealing, where the lower panels in FIG. 11(b) and FIG. 11(c) show thickness profiles (~18 nm) before and after thermal treatment, respectively.

FIG. 11a shows UV-IR optical absorbance spectra of an ambient exposed BP flake and after thermal annealing in argon at 150° C. for 1 hour. A comparative change in the spectra after thermal annealing can be associated with the evaporation of surface adsorbates on BP. Furthermore, AFM scans of a BP flake show improved surface morphology with ~31% reduction in average surface roughness after thermal annealing of the flake (FIG. 11b and FIG. 11c).

Long Term Performance and Stability of BP Devices

Figure 12:
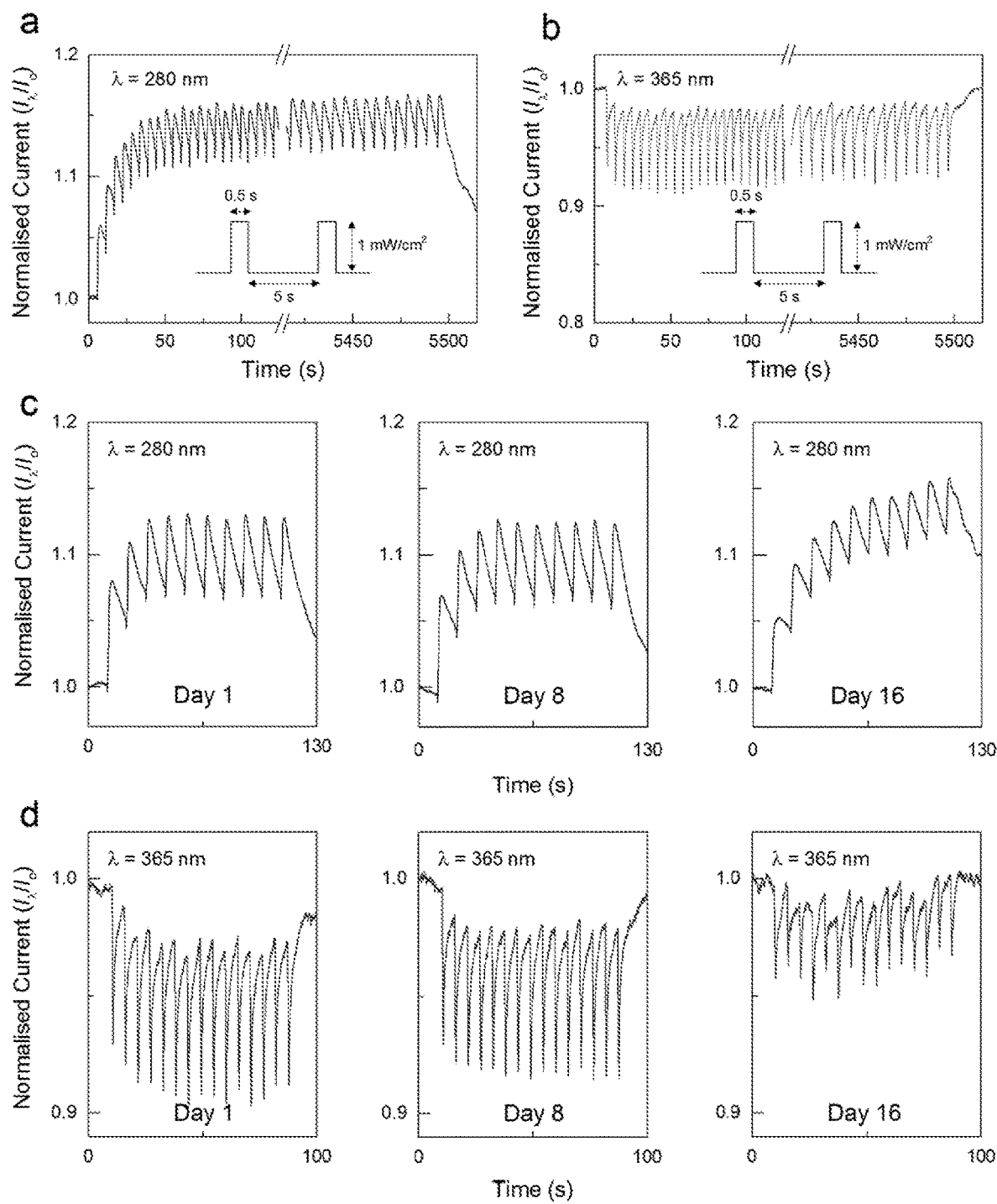
FIG. 12 shows plots showing the cyclic endurance of a BP optoelectronic device measured for 10$^3$ switching cycles when illuminated under (a) 280 nm and (b) 365 nm, where short optical pulses with a pulse width of 0.5 s, a period of 5 s and a power density of 1 mW/cm$^2$ are illuminated on the device under dark ambient, and a time stability plot of the BP optoelectronic device over the duration of 16 days evaluated by the photocurrent when illuminated under (c) 280 nm and (d) 365 nm.

The cyclic endurance and stability of the BP optoelectronic devices are evaluated under ambient conditions. FIG. 12a and FIG. 12b show cyclic endurance of a BP device for 10$^3$ illumination cycles of 280 nm and 365 nm wavelengths, respectively. The BP devices (five different devices test for endurance tests) show stable switching performance without any significant decay in photoresponse.

The time stability of BP devices is evaluated over 16 days (FIG. 12c and FIG. 12d). Devices show a slight change in the magnitude of photocurrent after 8 days. However, a significant change in the photocurrent is observed after 16 days which can be attributed to the partial degradation of BP flake leading to poor electrical conduction and photoresponse.

Figure 13:
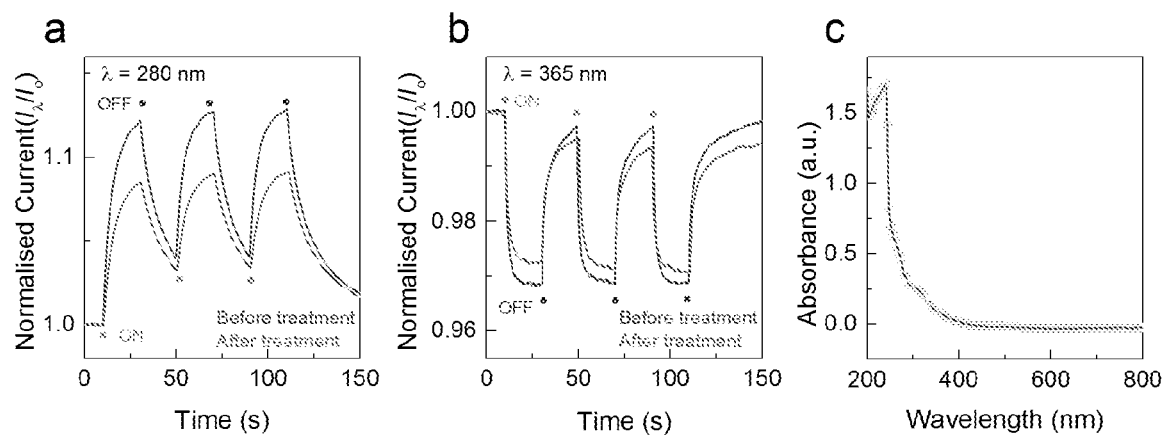
FIG. 13 shows plots showing the normalised transient photoresponse of a BP device under (a) 280 nm and (b) 365 nm excitation wavelengths before and after treating with [BMIM][BF$_4$] ionic liquid, where surface treatment is carried out by drop-casting the ionic liquid onto the BP device for 45 minutes followed by rinsing in acetonitrile and N$_2$ blow dry, and (c) a UV-visible absorbance profile of [BMIM][BF$_4$]

To protect the BP devices from extensive ambient degradation, the inventors believe that by employing a surface passivation approach utilizing imidazolium-based ionic liquid (such as 1-butyl-3-methylimidazolium tetrafluoroborate, [BMIM][BF$_4$]), the stability of BP devices can be extended beyond 16 days.[38] FIG. 13a and FIG. 13b shows that the BP device retains a positive and negative photoresponse under 280 nm and 365 nm wavelengths, respectively, after surface treatment with [BMIM][BF$_4$]. A small drop (<3%) in the photoresponse after treatment can be associated with the absorbance of [BMIM][BF$_4$] in UV region (FIG. 13c).

TEM Analyses of BP Exfoliated in Ambient

Figure 14:
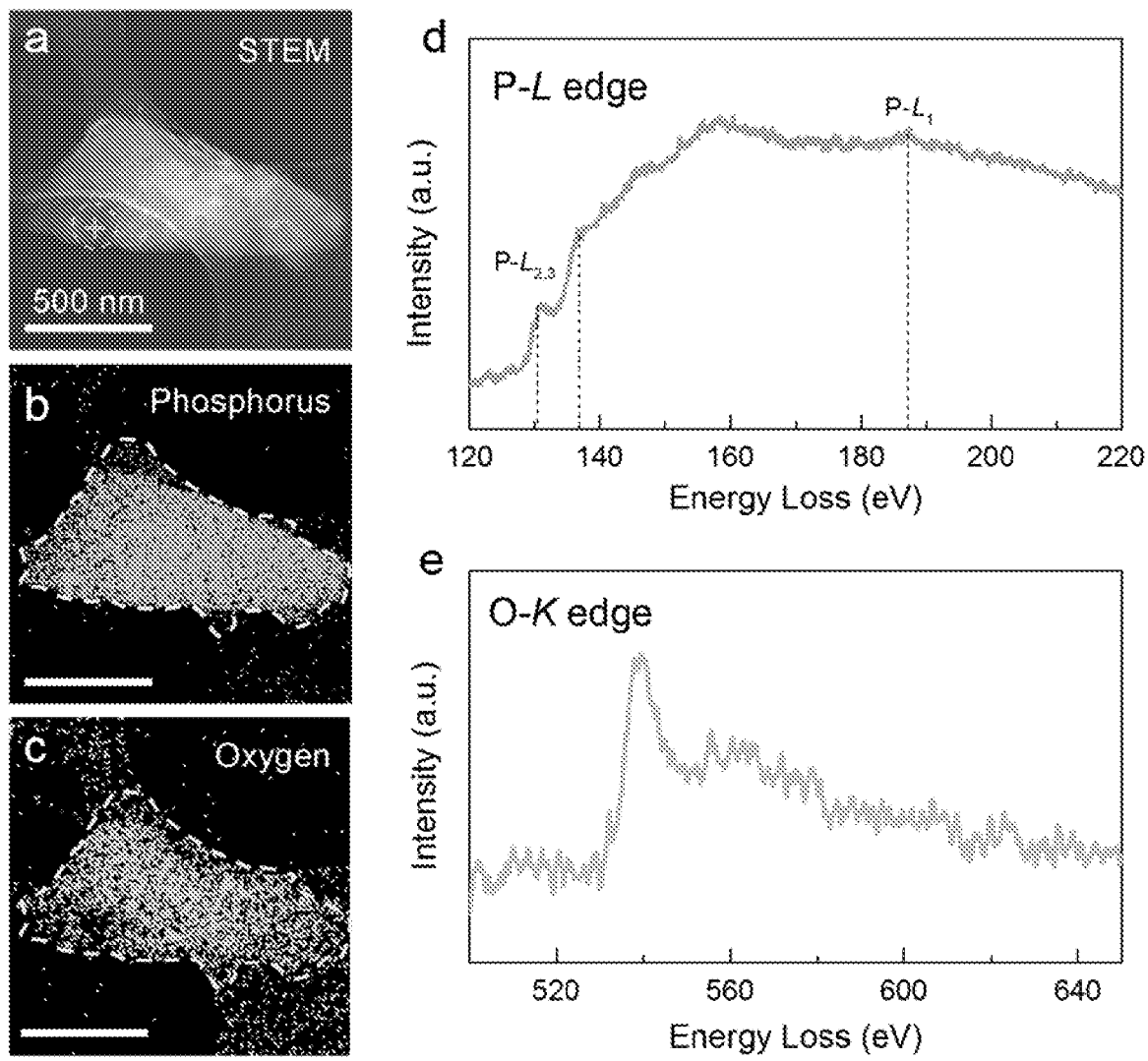
FIG. 14 shows (a) a scanning transmission electron microscopy (STEM) image of a mechanically exfoliated BP flake, taken at 80 kV, elemental energy dispersive spectroscopy (EDS) area maps of (b) phosphorus and (c) oxygen collected from the BP flake in FIG. 14(a), and electron energy loss spectroscopy (EELS) spectra of (d) P-L edge and (e) O-K edge corresponding to a selected point highlighted in FIG. 14(a)

FIG. 14a shows a scanning transmission electron microscopy (STEM) micrograph of mechanically exfoliated BP on a lacey carbon grid. The layered structure of BP can be clearly observed from color contrast of the representative flake. Chemical purity of the exfoliated BP is inspected by corresponding elemental energy dispersive spectroscopy (EDS) area maps of phosphorus and oxygen as shown in FIGS. 14b and 14c, respectively. Comparative EDS elemental maps show oxygen signals on the BP which can be associated with oxygen absorption on the surface during sample preparation and exposure to the ambient environment. The electron energy loss spectroscopy (EELS) spectra collected from a point on the BP flake (highlighted in FIG. 14a) are analysed to access oxygen adsoption on the BP. The core-loss P-L edge and O-K edge EELS spectra, shown in FIG. 14d and FIG. 14e respectively, further confirms the surface oxidation of the representative BP flake.

Photoresponse of BP Devices

Broadband BP Photodetectors

Figure 15:
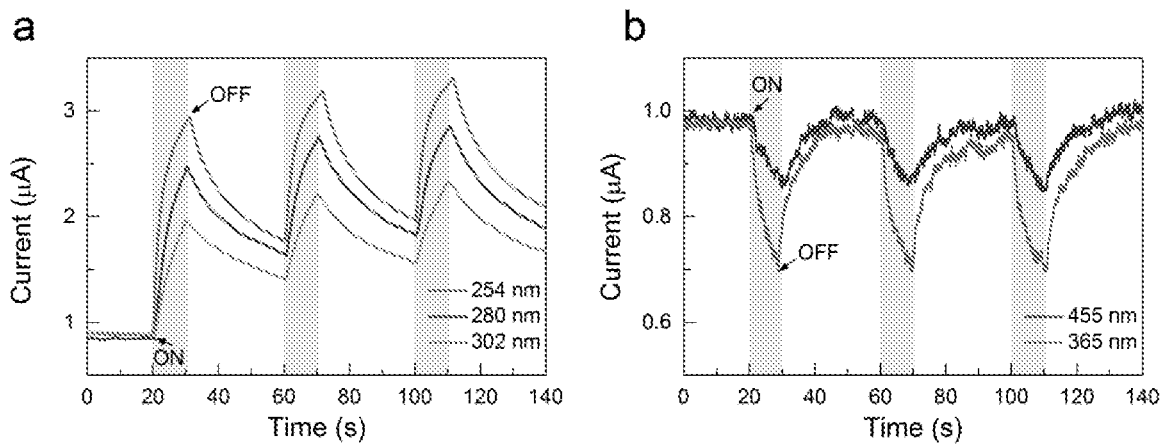
FIG. 15 shows (a) a plot showing the measured current under UV-C (254 nm) and UV-B (280 nm and 302 nm) irradiation pulses with an illumination time of 10 s, a period of 30 s and a fixed power density of 1 mW/cm$^2$, (b) a plot showing the measured current under UV-A (365 nm) and visible (455 nm) illumination pulses with a power density of 1 mW/cm$^2$ and 5 mW/cm$^2$, respectively.

The photoresponse of BP photodetectors is measured under a wide range of illumination wavelengths, covering UV-C (254 nm), UV-B (280 nm and 305 nm), UV-A (365 nm) and visible (455 nm) bands in the electromagnetic spectrum. FIG. 15a shows the excitation with shorter UV wavelengths (≤302 nm, UV-B and UV-C) results in positive photoresponse. Whereas a negative photoresponse is observed under the illumination of 365 nm (UV-A) and 455 nm (visible) wavelengths (FIG. 15b).

In FIG. 15a, the difference in the magnitude of photocurrent under illumination, under a fixed power density (1 mW/cm$^2$) can be associated with the photon energy of the excitation wavelengths. Furthermore, the measured positive photocurrent under wavelengths with high photon energy (4.1 eV) and negative photocurrent under wavelengths with low photon energy (3.39 eV) is consistent with the DFT simulations shown in FIG. 7.

Power-Dependent Photoresponse

Figure 16:
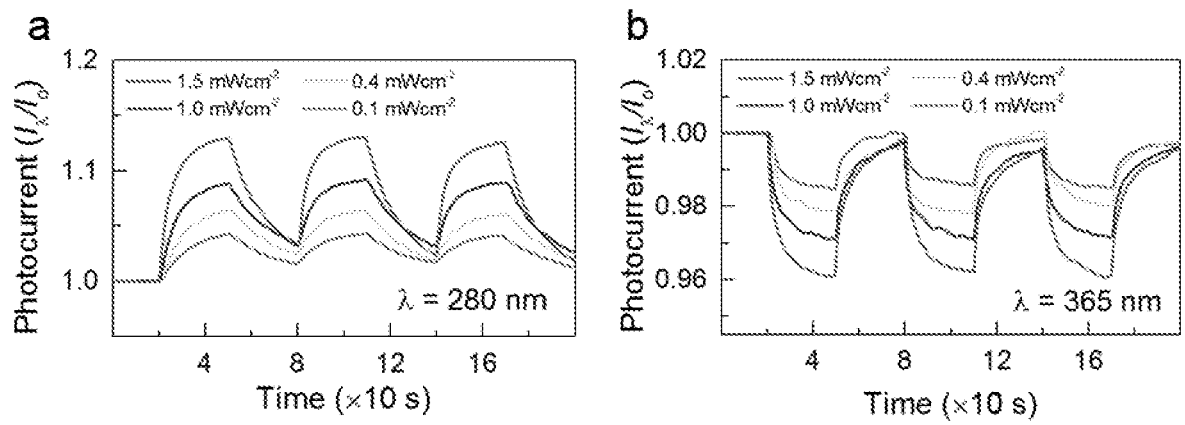
FIG. 16 shows plots showing the time-resolved normalised photocurrent under different power densities of pulsed (a) UV-B (λ=280 nm) and (b) UV-A (λ=365 nm) excitation wavelengths.

To assess the effect of illumination power on photoresponse of the BP devices fabricated on SiO$_2$/Si substrate, transient photocurrent is measured as function of varying incident power ranging between 100 μW/cm$^2$ and 1.5 mW/cm$^2$. FIG. 16 shows that BP is sensitive to the incident power density of both UV-B (FIG. 16a) and UV-A (FIG. 16b).

Recovery Time of BP Devices

Figure 17:
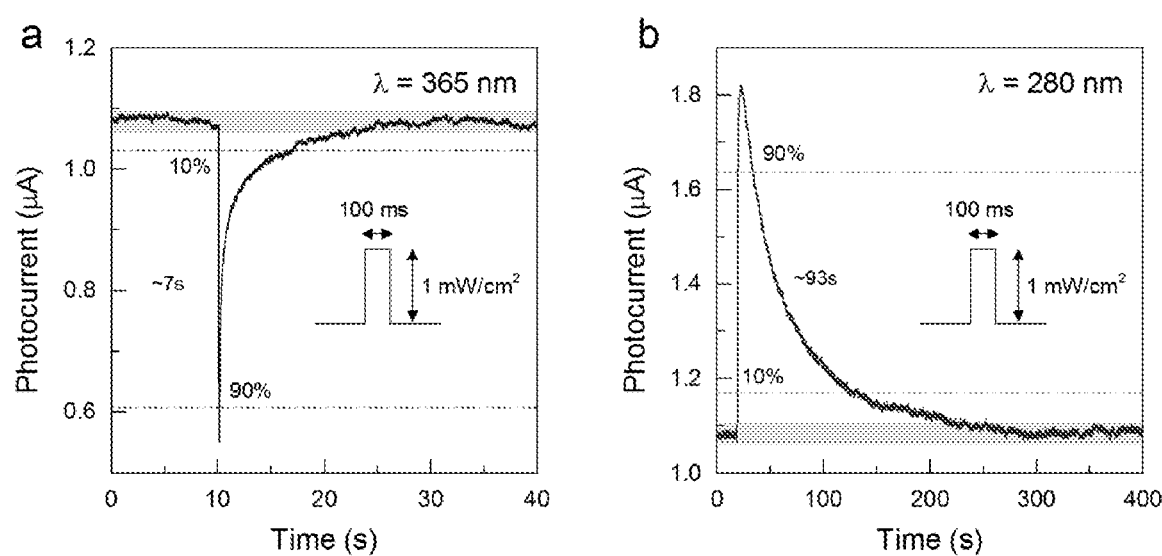
FIG. 17 shows plots showing (a) the transient photocurrent under 365 nm excitation wavelength, and (b) the transient photocurrent under 280 nm excitation wavelength, where the photocurrent is measured for a short excitation pulse with a pulse width of 100 ms at a constant illumination power density of 1 mWcm$^{-2}$ and $V_{DS}$ of 50 mV.

Transient photocurrent of a BP device under a short pulse (100 ms) of UV-A (365 nm) and UV-B (280 nm) illumination wavelengths (at a constant power density of 1 mWcm$^{-2}$) are shown in FIGS. 17a and 17b, respectively. The recovery/fall time for both excitation wavelengths are measured between 10-90% of the photocurrent. When UV-A illumination is turned off, photocurrent recovers back to 10% margin in ~7 s whereas it takes ~93 s after UV-B excitation. This indicates that the BP devices described herein exhibit a persistent photocurrent under 280 nm excitation wavelength.

Optoelectronic Digital Logic Operations

Scalable optoelectronic devices capable of performing logic computation with optical signals are highly desired for future applications because light renders ultrafast computational speed due to high bandwidth, low crosstalk and ultralow power-consumption. In this context, it is possible to exploit the opposing-polarity photoresponse of few-layer BP under different UV wavelengths to demonstrate an optoelectronic logic element.

Figure 18:
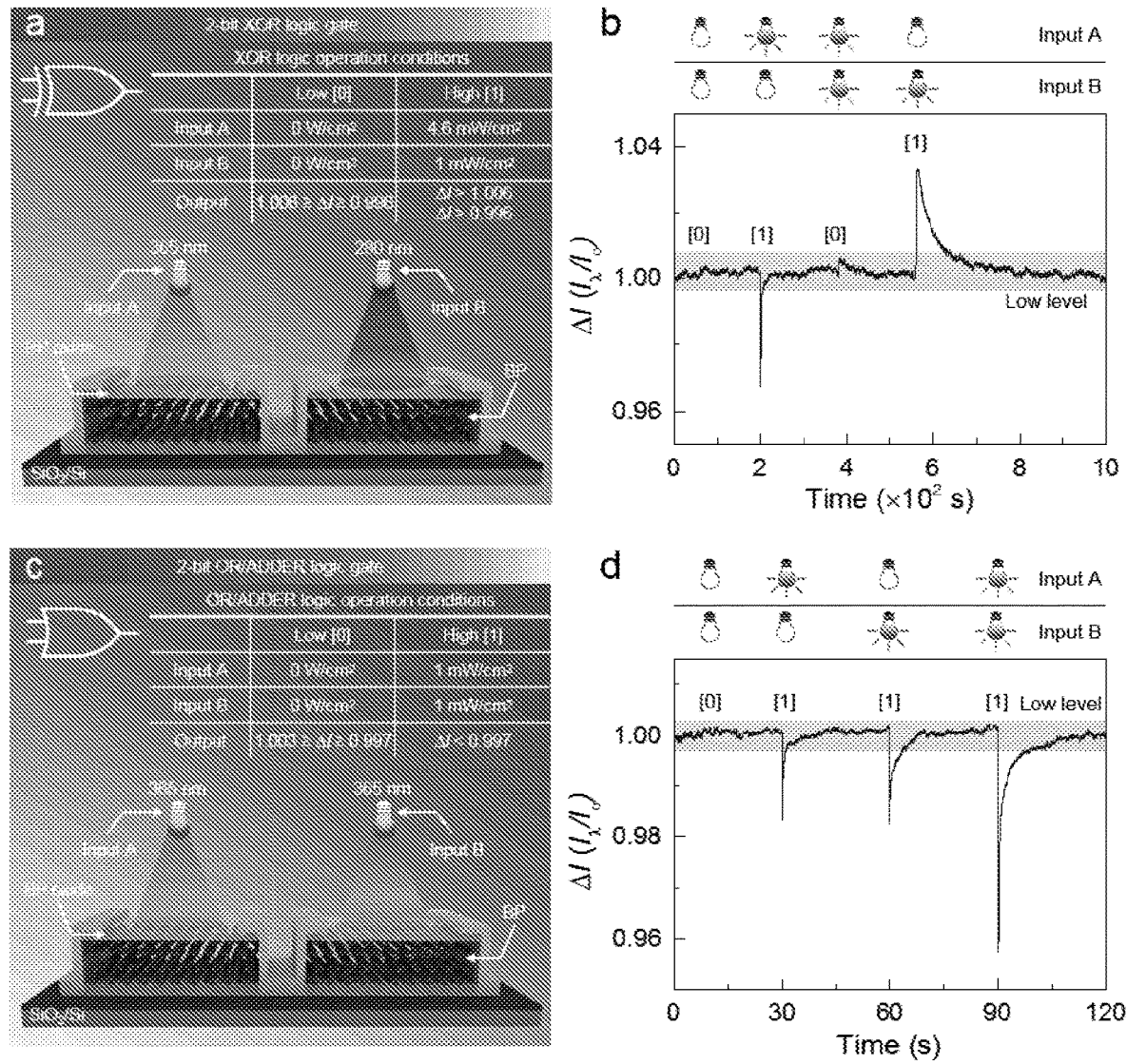
FIG. 18 shows (a) a schematic representation of two serially integrated few-layer BP devices on a rigid SiO$_2$/Si substrate for use in performing 2-bit optoelectronic exclusive OR (XOR) logic operation, in which excitation wavelengths of 365 nm and 280 nm with different incident power density are used as optical input signals on Input A and Input B, respectively, thereby inducing a similar magnitude in the change in output current, where the inset table lists conditions for optoelectronic XOR logic operation, while (b) shows a plot that shows the change in output current (ΔI) verses time for different input configurations, where the shaded region represents the current level where output is regarded as Low [0] and is defined in inset table of FIGS. 18(a), and (c) shows a schematic representation of an integrated device performing 2-bit optoelectronic OR/ADDER logic operation, using the same excitation wavelength of 365 nm for Input A and Input B, where the inset table lists conditions for OR/ADDER logic operation, and (d) shows a plot that shows the output response for different Input A-B configurations. In both FIG. 18(a) and FIG. 18(b), the output current is measured under a constant 50 mV bias.

FIG. 18a shows a schematic illustration of an integrated 2-bit optoelectronic exclusive OR (XOR) logic gate where 365 nm and 280 nm wavelengths act as Input A and Input B, respectively, for two serially connected BP devices. In the optical input-electronic output logic devices, output digital states (Output) are defined as the change in output current (ΔI) corresponding to a defined threshold. For XOR logic operation, the conditions for both optical inputs are set to induce similar magnitude of ΔI as stated in the inset of FIG. 18a. The time trace of ΔI for 2-bit XOR operation (FIG. 18b) shows that when both optical inputs are Low [0-0] or High [1-1], the output ΔI does not increase/decrease than the defined threshold and retains a Low-level [0] (depicted by a shaded region and defined in the inset table of FIG. 18a). On the other hand, the Output ΔI changes the magnitude to High [1] when either of the two inputs is High, exhibiting an optical XOR logic operation.

FIG. 18c shows a schematic illustration of a 2-bit optoelectronic OR/ADDER logic operation where the binary optical input signals are added to provide an output that is an analog equivalent to the digital sum.

FIG. 18d shows the time trace of ΔI for OR/ADDER logic operation for different input configurations where same 365 nm wavelength is illuminated for both Input A and Input B. Interestingly, magnitude of the photoresponse almost doubles when both inputs are High which can be associated with the summation of photogenerated charge carriers. In this integrated device configuration, OR/ADDER logic operation can also be performed by illuminating 280 nm wavelength as Input A and Input B. In the future, the high-fidelity optical OR/ADDER logic operation can be extended to perform more complex operations (such as an optoelectronic digital-to-analog convertor) by fabricating multiple integrated devices.

Since these BP devices exhibit a positive photoresponse under shorter UV wavelengths (302 nm) and a negative photoresponse under longer UV and visible wavelengths (365 nm and 455 nm, respectively), the selection of any two wavelengths for an application can result in comparatively different magnitudes of photocurrent without affecting the capability to execute that application. Similarly, due to the intrinsic anisotropic optical absorbance of BP, the magnitude of photocurrent is higher for polarized light along armchair direction than zigzag. As such, regardless of the light's polarization direction the capability of these BP devices to exhibit a unique combination of positive and negative photoresponse for multifunctional applications remains unchanged.

Flexible BP Photodetector 10B

A few-layer BP photodetector (hereinafter referenced as 10B) configured for discriminating between different wavelength regions of the electromagnetic spectrum, more particularly, to the wavelength regions associated with the UV-A (315 nm to 400 nm) and UV-B (280 nm to 315 nm) components of sunlight, has been fabricated on a flexible substrate according to another preferred embodiment of the present invention.

The inventors have found that by manifesting the flexible UV-B and UV-A discriminating BP photodetector 10B renders its adaptability for various working environments and applications such as flexible and wearable electronics.

The flexible substrate 20 may be manufactured from any one of a range of suitable polymers including, but not limited to a polymer selected from the group consisting of poly(ethylene 2,6-naphthalate) (PEN), polyethylene imine (PEI), poly(methyl methacrylate) (PMMA), polyimide (PI), polyethylene terephthalate (PET), and polydimethylsiloxane (PDMS).

In one embodiment, the flexible substrate 20 used to support the few-layer BP sensing element 40 is manufactured from poly(ethylene 2,6-naphthalate) (PEN) at a thickness of 125 μm.

In one other embodiment, and as shown in the micrograph in FIG. 2b, the flexible substrate 20 used to support the few-layer BP sensing element 40 is manufactured from a flexible polyimide (PI) sheet.

It will be appreciated by persons of ordinary skill in the relevant art that the BP micro-flake sensing element 40 and the pair of terminal electrodes 30, 35 are deposited on the surface of the flexible photodetector 10B using the same process as described above in respect of the photodetector 10A formed on the surface of the SiO$_2$/Si substrate.

The performance of this flexible BP photodetector 10B has been evaluated under varying UV-B/UV-A illumination power densities (mWcm$^2$) and different mechanical bending cycles and radii. Similar to the BP photodetector 10A fabricated on a SiO$_2$/Si substrate described above, this flexible BP photodetector 10B has also been found to exhibit a power dependent photoresponse.

Figure 19:
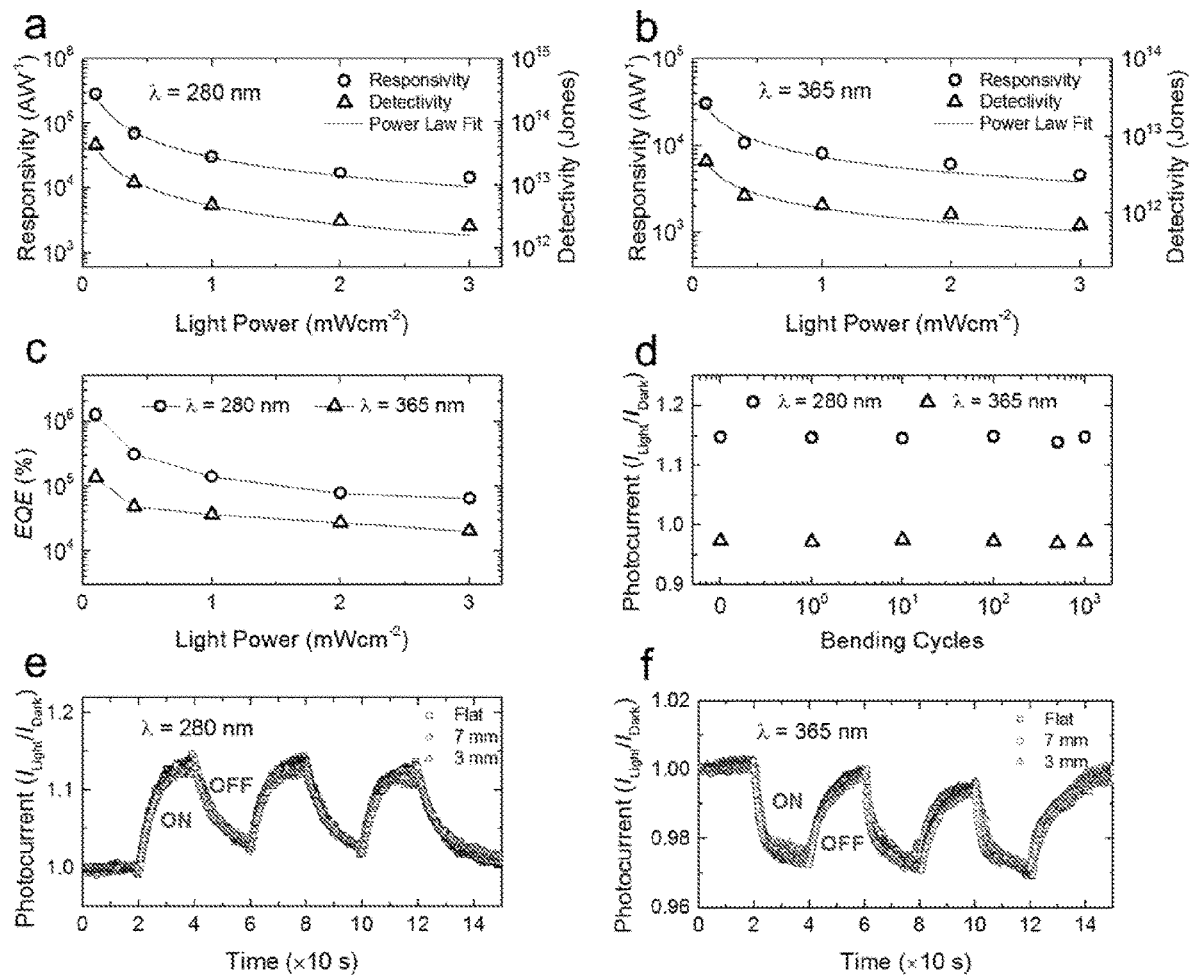
FIG. 19 shows plots demonstrating the performance of a flexible photodetector comprising a few layer black phosphorus (BP) sensing element fabricated on a PEN substrate, according to another preferred embodiment of the present invention, including: Power-dependent responsivity (AW$^{-1}$; open circles) and detectivity (open triangles) under (a) UV-B and (b) UV-A illuminations with power densities ranging from 0.1 mWcm$^{-2}$ to 3 mWcm$^{-2}$, in which the experimental data is fitted according to the power law (R∝P$_\lambda^{\alpha-1}$), where α is deduced to be ~0.96 and ~0.60 for UV-B and UV-A illumination, respectively; (c) Power-dependent external quantum efficiency (%) under UV-B (open circles) and UV-A (open triangles) illumination; (d) Normalised photocurrents ($I_{Light}/I_{Dark}$) measured as a function of bending cycle, in which the bending radius is set to ~3 mm during an automatized bending test; and Normalised photocurrent ($I_{Light}/I_{Dark}$) vs. time (×10 s) profiles for UV-B illumination (e) and UV-A illumination (f) measured on different curvature radii, in which the data is collected with a drain to source voltage ($V_{DS}$) of 50 mV.

For instance, FIGS. 19a and 19b show an illumination power dependent responsivity (AW$^{-1}$) and detectivity results for this representative flexible BP photodetector 10B under UV-B and UV-A irradiation, respectively, when subjected to the corresponding illumination wavelengths (280 nm and 365 nm) with power densities ranging from 0.1 mWcm$^{-2}$ to 3 mWcm$^{-2}$.

In particular, and as shown in FIG. 19a, a maximum responsivity of 2.8×10$^5$ AW$^{-1}$ and corresponding detectivity of 4.3×10$^{13}$ Jones is measured for UV-B (280 nm) illumination under a power density of 0.1 mWcm$^{-2}$. While as shown in FIG. 19b, a maximum responsivity and corresponding detectivity measured for UV-A (365 nm) illumination under a power density of 0.1 mWcm$^{-2}$ is 3.1×10$^4$ AW$^{-1}$ and 4.7×10$^{12}$ Jones, respectively.

FIG. 19c shows a power dependent external quantum efficiency (%, EQE) for this representative flexible BP photodetector 10B under UV-B (280 nm; open circles) and UV-A (365 nm; open triangles) irradiation. The highest quantum efficiency of 1.2×10$^6$% is measured for UV-B excitation under a power density of 0.1 mWcm$^{-2}$. These figures-of-merit are comparable with the calculated results indicated above for the BP photodetector 10A fabricated on the rigid SiO$_2$/Si substrate. This suggests that the photoconduction mechanism of the BP sensing element 40 under short excitation wavelengths (at least in the UV range) is independent of the type of substrate 20, which is contrary to that reported in the literature in respect of longer excitation wavelengths (near-infrared and above).[9]

FIGS. 19d-19f provide performance results for the flexible BP photodetector 10B (fabricated on a PI substrate) when evaluated under mechanical flexibility conditions.

Specifically, FIG. 19d shows the normalised photocurrent ($I_{Light}/I_{Dark}$) measured after systematic bending cycles applied by an automatized flexing stage, in which the bending radius was set to ~3 mm during the automatized bending test. As shown, the normalised photocurrent ($I_{Light}/I_{Dark}$) measured under both UV-B (280 nm) and UV-A (365 nm) illuminations show negligible variations during 1000 bending cycles with a curvature radii of ~3 mm.

Furthermore, and as shown in FIGS. 19e and 19f, the normalised photocurrents ($I_{Light}/I_{Dark}$) vs. time (×10 s) profiles have been recorded under different bending radii for UV-B (FIG. 19e) and UV-A (FIG. 19f) illuminations, in which the data is collected with a $V_{DS}$ of 50 mV. The photocurrents vs. time profiles show no significant deviation when measured on a flat and bent supports.

These results indicate that the flexible BP photodetector 10B with superior photoresponse and robust mechanical tolerance could be adopted as a sensing component in future sensing and imaging systems such as personal UV protection and wearable electronics.

CONCLUSION

The inventors have found that the BP micro-flake sensing element 40 of the photodetectors (10, 10A, 10B) described above is responsive to electromagnetic radiation in the UV-A, UV-B wavelength regions to yield a change in photocurrent measured between the terminal electrodes 30, 35 of the photodetector (10, 10A, 10B) as a function of the intensity (mWcm$^{-2}$) of the UV-A and UV-B radiation impinging thereon. The inventors have shown that exposure to UV-B (280 nm) irradiation has a positive dependency on the intensity, while exposure to UV-A (365 nm) illumination has a negative dependency on the intensity.

By virtue of this observation, the inventors have identified a means by which to discriminate between two different UV wavelength regions of the electromagnetic spectrum.

The UV-A/B discriminating photodetectors (10, 10A, 10B) described in herein, offers a simple and comparatively easy to fabricate device structure, which offers a cost-effective alternative to currently available technology, which typically require specialized substrates and processes which limit their adoptability for applications.

The inventors have found that the photodetectors (10, 10A, 10B) described above utilize very low operational voltages (<0.2 V) to measure photocurrent produced as a result of UV-A and UV-B illumination wavelengths impinging on the surface of the BP micro-flake sensing element 40 of these as-fabricated photodetectors (10, 10A, 10B). Indeed, several figures-of-merit such as responsivity, detectivity and external quantum efficiency (%, EQE) that have been calculated herein to quantify and evaluate the performance of said photodetectors, are clearly better than the corresponding results obtained for a number of convention al sensors on the market. For instance, the responsivity of 3.2×10$^5$ A/W and 7.8×10$^4$ A/W measured for UV-B (280 nm) and UV-A (365 nm) illumination, respectively, are (to the best of the inventors' knowledge) the highest for any UV-B/UV-A discriminating photodetector.

The inventors believe that the photodetectors (10, 10A, 10B) described above, can be integrated with CMOS circuits and find wide application in the field of flexible/wearable electronics that can be used to continuously monitor a person's exposure to the harmful UV-A and UV-B rays of sunlight. The inventors also believe that these photodetectors (10, 10A, 10B) may also find application in photometry apparatuses, for example photographic exposure meter.

Under a constant UV-B/UV-A illumination power density, the inventors have found that the photocurrent is independent of the crystal thickness of the BP micro-flake sensing element 40 used in the as-fabricated photodetectors (10, 10A, 10B) for a range of thicknesses from ~5 nm to ~45 nm. This highlights the significant technological relevance that the BP sensing element 40 can effectively sense and discriminate between UV-B (280 nm to 315 nm) and UV-A (365 nm to 315 nm) irradiation regardless of the crystal thickness.

Materials and Methods

Commercial bulk black phosphorus (BP) crystals were obtained from Smart-Elements GmbH (Austria) and used without further purification prior to use. Glass and SiO$_2$/Si used as the substrate for the photodetector 10A were obtained from Silicon Materials Inc. Polymers such as polyethylene naphthalate (PEN), polyimide (PI) and polyethylene terephthalate (PET) used as the substrate for the flexible photodetector 10B were obtained from Sigma-Aldrich.

Substrates were cleaned by thoroughly rinsing in acetone, isopropanol (purchased from Sigma-Aldrich) and deionized water, sequentially, for 5 minutes each. Finally, the substrates were blown dry with compressed nitrogen gas.

Briefly, few-layer thin black phosphorus (BP) micro-flakes are produced by applying a piece of adhesive tape onto the surface of the bulk BP crystal and peeling off a small amount of material by mechanical exfoliation. Optical contrast is then used to identify those BP micro-flakes having a thickness that falls within the range of 3 nm to 30 nm. The freshly exfoliated BP micro-flakes are then transferred onto the surface of an insulating substrate such as glass, SiO$_2$/Si or polymer such as polyethylene naphthalate (PEN), polyimide (PI) and polyethylene terephthalate (PET), where they adhere firmly by virtue of the surface energy of the cleaned substrate surface.

Electron beam lithography and photolithography were used to pattern conductive contacts in the form of metal electrodes on the selected BP flakes with different thicknesses ranging from ~5.7 nm to ~45 nm. These conductive contacts are defined on the surface of the substrate using thin films of low electrical resistance, which can be any category of metal or conductive metal oxides (such as Cr/Au, Cr/Pt, Ni, Al, indium tin oxide, Al-doped zinc oxide).

Specifically, metal electrodes Cr/Au (5/70 nm) and Ti/Au (5/70 nm) were deposited on the developed patterns using electron beam evaporation. These conductive contacts are patterned to be in electrical contact with the BP micro-flake on the substrate surface in two-terminal or four-terminal configurations for the measurement of photocurrent. For instance, in the case of the two-terminal configuration, an MA6 mask aligner (Suss MicroTec AG, Germany) was used to pattern a pair of contact electrodes onto the surface of the substrate such that the two patterned electrodes are in electrical contact with the BP micro-flake in mutually spaced apart and opposing relation in the Drain-Source configuration (along the armchair direction). Each electrode is formed by using a ProLine75 electron beam evaporator (Kurt J. Lesker Co., USA) to firstly deposit a thin film of a metal such as Cr, Ti, Al onto the surface of the substrate as an adhesion layer, and then subsequently using the same evaporator to deposit a thin film of a second metal such as Au, Pt, Pd, Ni onto the adhesion layer. Finally, the lift-off in acetone was carried out to reveal the required metallic contact pads for micro-probes and electrical measurement.

The electrical measurements were conducted using a Keithley 4200SCS semiconductor parameter analyser and Agilent 2912A source meter. All measurements were performed under dark conditions with exposure to only the target illumination wavelengths. The field dependent carrier mobilities ($\mu$) were extracted from the equation;

$$\mu = \frac{L}{W \cdot C_{ox} \cdot V_{DS}} \frac{dI_{DS}}{dV_{GS}},$$

where $$\frac{dI_{DS}}{dV_{GS}}$$

is the transconductance, L is the channel length, W is the channel width, $C_{ox}$ is the $SiO_2$ capacitance (calculated as 115 $\mu Fm^{-1}$) and $V_{DS}$ is the drain-source voltage.

The photocurrent measurements of the resultant photodetectors were obtained in the probe configuration using a B2912A Precision Source/Measurement Unit (Keysight Technologies, USA). Specifically, commercial UV-A and UV-B light emitting diodes (M365L2 and M280L3, respectively, from Thorlabs, Inc., USA) were used as illumination sources to illuminate the surface of the photodetectors. The illumination power of the UV-A and UV-B LEDs was calibrated using a commercial 818-UV/DB low-power UV-enhanced silicon photodetector (Newport Corporation, USA). The excitation frequency and pulse width of the light sources were controlled by a programmable Arduino-Uno microcontroller board.

AFM topographic scans of the exfoliated BP flakes were conducted on a Dimension-Icon AFM in ScanAsyst mode. The Raman spectra were obtained by using a Horiba LabRAM Evolution micro-Raman system equipped with 9 mW, 532 nm laser (0.5 μm lateral resolution, 0.25 s exposure), and a 50× objective.

BP flakes were transferred onto the lacey carbon grids. For cross-sectional analysis of BP devices, thin lamellae were prepared by focused ion beam (FIB) using a FEI Scios DualBeam FIBSEM system. Then TEM characterisations were carried out using a JEOL 2100F scanning transmission electron microscope (STEM) with attached Tridium Gatan image filter, operating at 80 kV acceleration voltage. For electron energy loss spectroscopy (EELS) data analysis, power law fits were used for P-L and O-K pre-edge background corrections where the influence of nearby peaks and plural scattering were removed by selecting narrow signal windows.

To obtain the atomic and electronic structures of the phosphorene, we perform spin-unrestricted DFT calculations with the SIESTA code[40] using the generalized gradient approximation for the exchange-correlation function as developed by Perdew, Burke and Ernzerhof (PBE).[41] The SIESTA code uses basis sets comprised of numerical atomic orbitals, and approximates the atomic potential in terms of Troullier-Martins[42] norm-conserving pseudopotentials. The auxiliary basis uses a real-space mesh with a kinetic energy cut-off of 500 Ry, and the basic functions are radially confined using an energy shift of 0.005 Ry.[40] We allow full atomic relaxation until the forces on the atoms are less than 0.01 eV/A. The size of the k-points space is 3×3×1 for all structures considered.

The UV-visible absorbance profiles of an ambient exposed BP flake before and after annealing was measured by CRAIC 20/30 XL UV-Vis micro-spectrophotometer.

Other Embodiments

It will be appreciated by those skilled in the relevant art that the choice of flexible substrate is not limited to PI or PEN as described above, but that other flexible substrates may also be fit for purpose.

For instance, it will be appreciated that the photodetector for discriminating between wavelength regions associated with UV-A and UV-B components of sunlight are not limited to being formed on a substrate 20 such as $SiO_2$/Si, PI or PEN as described above, and that alternative substrates 20 may be used in the fabrication of such photodetectors For instance, the substrate of the photodetector may be manufactured from a material selected from the group consisting of glass, polyethylene imine (PEI), poly(methyl methacrylate) (PMMA), polyethylene terephthalate (PET), or polydimethylsiloxane (PDMS), as required.

In an alternative form, the substrate may be a glass or $SiO_2$/Si substrate that has been coated with one of the above materials.

REFERENCES

[1]. Ahmed, T.; Balendhran, S.; Karim, M. N.; Mayes, E. L. H.; Field, M. R.; Ramanathan, R.; Singh, M.; Bansal, V.; Sriram, S.; Bhaskaran, M.; Walia, S., Degradation of black phosphorus is contingent on UV-blue light exposure. *npj 2D Mater. Appl.* 2017, 1 (1).

[2]. Qiao, J.; Kong, X.; Hu, Z.-X.; Yang, F.; Ji, W., High-mobility transport anisotropy and linear dichroism in few-layer black phosphorus. *Nature communications* 2014, 5.

[3]. Liu, H.; Du, Y.; Deng, Y.; Peide, D. Y., Semiconducting black phosphorus: synthesis, transport properties and electronic applications. *Chemical Society Reviews* 2015, 44 (9), 2732-2743.

[4]. Gong, X.; Tong, M.; Xia, Y.; Cai, W.; Moon, J. S.; Cao, Y.; Yu, G.; Shieh, C.-L.; Nilsson, B.; Heeger, A. J., High-detectivity polymer photodetectors with spectral response from 300 nm to 1450 nm. *Science* 2009, 325 (5948), 1665.

[5]. Buscema, M.; Groenendijk, D. J.; Blanter, S. I.; Steele, G. A.; van der Zant, H. S.; Castellanos-Gomez, A., Fast and broadband photoresponse of few-layer black phosphorus field-effect transistors. *Nano Lett* 2014, 14 (6), 3347-52.

[6]. Huang, M.; Wang, M.; Chen, C.; Ma, Z.; Li, X.; Han, J.; Wu, Y., Broadband Black-Phosphorus Photodetectors with High Responsivity. *Adv Mater* 2016, 28 (18), 3481-5.

[7]. Chen, X.; Lu, X.; Deng, B.; Sinai, O.; Shao, Y.; Li, C.; Yuan, S.; Tran, V.; Watanabe, K.; Taniguchi, T.; Naveh, D.; Yang, L.; Xia, F., Widely tunable black phosphorus mid-infrared photodetector. *Nat Commun* 2017, 8 (1), 1672.

[8]. Wu, J.; Koon, G. K. W.; Xiang, D.; Han, C.; Toh, C. T.; Kulkarni, E. S.; Verzhbitskiy, I.; Carvalho, A.; Rodin, A. S.; Koenig, S. P.; Eda, G.; Chen, W.; Neto, A. H. C.; Ozyilmaz, B., Colossal ultraviolet photoresponsivity of few-layer black phosphorus. *ACS Nano* 2015, 9 (8), 8070-8077.

[9]. Miao, J.; Song, B.; Li, Q.; Cai, L.; Zhang, S.; Hu, W.; Dong, L.; Wang, C., Photothermal effect induced negative photoconductivity and high responsivity in flexible black phosphorus transistors. *ACS Nano* 2017, 11 (6), 6048-6056.

[10]. F. Xia, H. Wang, Y. Jia, *Nat. Commun.* 2014, 5, 4458.

[11]. V. Tran, R. Soklaski, Y. Liang, L. Yang, *Phys. Rev. B* 2014, 89, 235319.

[12]. N. Mao, J. Tang, L. Xie, J. Wu, B. Han, J. Lin, S. Deng, W. Ji, H. Xu, K. Liu, L. Tong, J. Zhang, *J. Am. Chem. Soc.* 2016, 138, 300.

[13]. H. Yuan, X. Liu, F. Afshinmanesh, W. Li, G. Xu, J. Sun, B. Lian, A. G. Curto, G. Ye, Y. Hikita, Z. Shen, S. C. Zhang, X. Chen, M. Brongersma, H. Y. Hwang, Y. Cui, *Nat. Nanotechnol.* 2015, 10, 707.

[14]. C. Biswas, F. Gunes, D. L. Duong, S. C. Lim, M. S. Jeong, D. Pribat, Y. H. Lee, *Nano Lett.* 2011, 11, 4682.

[15]. L. Huang, W. C. Tan, L. Wang, B. Dong, C. Lee, K. W. Ang, *ACS Appl. Mater. Interfaces* 2017, 9, 36130.

[16]. S. Liu, N. Huo, S. Gan, Y. Li, Z. Wei, B. Huang, J. Liu, J. Li, H. Chen, *J. Mater. Chem. C* 2015, 3, 10974.

[17]. J. Y. Wu, Y. T. Chun, S. Li, T. Zhang, J. Wang, P. K. Shrestha, D. Chu, *Adv. Mater.* 2018, 30, 1705880.

[18]. K. L. Utt, P. Rivero, M. Mehboudi, E. O. Harriss, M. F. Borunda, A. A. Pacheco SanJuan, S. Barraza-Lopez, *ACS Cent. Sci.* 2015, 1, 320.

[19]. J. D. Wood, S. A. Wells, D. Jariwala, K.-S. Chen, E. Cho, V. K. Sangwan, X. Liu, L. J. Lauhon, T. J. Marks, M. C. Hersam, *Nano Lett.* 2014, 14, 6964.

[20]. S. Kuriakose, T. Ahmed, S. Balendhran, V. Bansal, S. Sriram, M. Bhaskaran, S. Walia, *2D Mater.* 2018, 5, 032001.

[21]. A. Favron, E. Gaufres, F. Fossard, A. L. Phaneuf-L'Heureux, N. Y. Tang, P. L. Levesque, A. Loiseau, R. Leonelli, S. Francoeur, R. Martel, *Nat. Mater.* 2015, 14, 826.

[22]. S. Walia, Y. Sabri, T. Ahmed, M. R. Field, R. Ramanathan, A. Arash, S. K. Bhargava, S. Sriram, M. Bhaskaran, V. Bansal, S. Balendhran, *2D Mater.* 2017, 4, 015025.

[23]. W. Gaoxue, J. S. William, P. Ravindra, P. K. Shashi, *2D Mater.* 2016, 3, 025011.

[24]. A. Ziletti, A. Carvalho, P. E. Trevisanutto, D. K. Campbell, D. F. Coker, A. H. Castro Neto, *Phys. Rev. B* 2015, 91, 085407.

[25]. A. Ziletti, A. Carvalho, D. K. Campbell, D. F. Coker, A. H. Castro Neto, *Phys. Rev. Lett.* 2015, 114, 046801.

[26]. P. Srivastava, K. P. S. S. Hembram, H. Mizuseki, K.-R. Lee, S. S. Han, S. Kim, *J. Phys. Chem. C* 2015, 119, 6530.

[27]. J. Lu, J. Wu, A. Carvalho, A. Ziletti, H. Liu, J. Tan, Y. Chen, A. H. Castro Neto, B. Özyilmaz, C. H. Sow, *ACS Nano* 2015, 9, 10411.

[28]. D. W. Boukhvalov, A. N. Rudenko, D. A. Prishchenko, V. G. Mazurenko, M. I. Katsnelson, *Phys. Chem. Chem. Phys.* 2015, 17, 15209.

[29]. T. Ahmed, S. Balendhran, M. N. Karim, E. L. H. Mayes, M. R. Field, R. Ramanathan, M. Singh, V. Bansal, S. Sriram, M. Bhaskaran, S. Walia, *npj 2D Materials and Applications* 2017, 1.

[30]. P. Srivastava, K. P. S. S. Hembram, H. Mizuseki, K.-R. Lee, S. S. Han, S. Kim, *The Journal of Physical Chemistry C* 2015, 119, 6530.

[31]. A. Ziletti, A. Carvalho, D. K. Campbell, D. F. Coker, A. H. Castro Neto, *Phys Rev Lett* 2015, 114, 046801.

[32]. D. Wang, D. Han, X. B. Li, S. Y. Xie, N. K. Chen, W. Q. Tian, D. West, H. B. Sun, S. B. Zhang, *Phys. Rev. Lett.* 2015, 114, 196801.

[33]. D. Wang, D. Han, D. West, N.-K. Chen, S.-Y. Xie, W. Q. Tian, V. Meunier, S. Zhang, X.-B. Li, *npj Comput. Mater.* 2019, 5.

[34]. D. Wang, X.-B. Li, D. Han, W. Q. Tian, H.-B. Sun, *Nano Today* 2017, 16, 30.

[35]. C. Elbadawi, R. T. Queralt, Z.-Q. Xu, J. Bishop, T. Ahmed, S. Kuriakose, S. Walia, M. Toth, I. Aharonovich, C. J. Lobo, *ACS Appl. Mater. Interfaces* 2018, 10, 24327.

[36]. S. Yang, A. Kim, J. Park, H. Kwon, P. T. Lanh, S. Hong, K. J. Kim, J. W. Kim, *Appl. Surf. Sci.* 2018, 457, 773.

[37]. S. Fan, S. Hei, C. An, W. Pang, D. Zhang, X. Hu, S. Wu, J. Liu, *J. Mater. Chem. C* 2017, 5, 10638.

[38]. S. Walia, S. Balendhran, T. Ahmed, M. Singh, C. El-Badawi, M. D. Brennan, P. Weerathunge, M. N. Karim, F. Rahman, A. Rassell, J. Duckworth, R. Ramanathan, G. E. Collis, C. J. Lobo, M. Toth, J. C. Kotsakidis, B. Weber, M. Fuhrer, J. M. Dominguez-Vera, M. J. S. Spencer, I. Aharonovich, S. Sriram, M. Bhaskaran, V. Bansal, *Adv. Mater.* 2017, 29, 1700152.

[39]. M. H. Jeong, D. Kwak, H. S. Ra, A. Y. Lee, J. S. Lee, *ACS Appl. Mater. Interfaces* 2018, 10, 19069.

[40]. M. S. Jose, A. Emilio, D. G. Julian, G. Alberto, J. Javier, O. Pablo, S.-P. Daniel, *J. Phys.: Condens. Matter* 2002, 14, 2745.

[41]. J. P. Perdew, K. Burke, M. Ernzerhof, *Phys. Rev. Lett.* 1996, 77, 3865.

[42]. N. Troullier, J. Martins, *Solid State Comm.* 1990, 74, 613.

Definitions

Whenever a range is given in the specification, for example, a temperature range, a time range, or concentration range, all intermediate ranges and subranges, as well as all individual values included in the ranges given are intended to be included in the disclosure. It will be understood that any subranges or individual values in a range or subrange that are included in the description herein can be excluded from the claims herein.

All definitions, as defined and used herein, should be understood to control over dictionary definitions, definitions in documents incorporated by reference, and/or ordinary meanings of the defined terms.

Throughout this application, the term "about" is used to indicate that a value includes the inherent variation of error for the device, the method being employed to determine the value, or the variation that exists among the study subjects.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

Spatially relative terms, such as "inner," "outer," "beneath," "below," "lower," "above," "upper," and the like, may be used herein for ease of description to describe one element or feature's relationship to another element(s) or feature(s) as illustrated in the Figures. Spatially relative terms may be intended to encompass different orientations of the device in use or operation in addition to the orientation depicted in the Figures.

While the invention has been described in conjunction with a limited number of embodiments, it will be appreciated by those skilled in the art that many alternatives, modifications and variations in light of the foregoing description are possible. Accordingly, the present invention is intended to embrace all such alternatives, modifications and variations as may fall within the spirit and scope of the invention as disclosed.

Where the terms "comprise", "comprises", "comprised" or "comprising" are used in this specification (including the claims) they are to be interpreted as specifying the presence of the stated features, integers, steps or components, but not precluding the presence of one or more other features, integers, steps or components, or group thereof.

The claims defining the invention are as follows:

1. A sensor for discriminating between wavelength regions in an electromagnetic spectrum, comprising:
    a substrate;
    a sensing element supported on a surface of the substrate; and
    at least one pair of terminal electrodes disposed on the substrate surface in mutually spaced apart and opposing relation, and in electrical contact with the sensing element, wherein the sensing element is responsive to electromagnetic radiation to yield a change in photocurrent measured between the terminal electrodes as a function of an intensity of the electromagnetic radiation impinging thereon, wherein a positive dependency on the intensity corresponds to a first wavelength region and a negative dependency on the intensity corresponds to a second wavelength region;
    wherein the sensing element comprises at least one black phosphorus flake, wherein the black phosphorus flake has a lateral dimension that is greater than 1 μm.

2. The sensor according to claim 1, wherein the first wavelength region corresponds to wavelengths that fall within a range of 315 nm to 400 nm, and the second wavelength region corresponds to wavelengths that fall within a range of 280 nm to 315 nm.

3. The sensor according to claim 1, wherein the black phosphorus flake has a bandgap greater than 0.2 electron volts.

4. The sensor according to claim 1, wherein the black phosphorus flake has a thickness that is greater than about 3 nm.

5. The sensor according to claim 1, wherein the black phosphorus flake comprises a plurality of black phosphorus layers.

6. The sensor according to claim 1, wherein the black phosphorus flake has a responsivity that falls within a range of $4.8 \times 10^4$ A/W to $4.9 \times 10^4$ A/W when subjected to UV-B irradiation at an intensity of 1 mW/cm$^2$.

7. The sensor according to claim 1, wherein the black phosphorus flake has a responsivity that falls within a range of $3.1 \times 10^5$ A/W to $3.2 \times 10^5$ A/W when subjected to UV-B irradiation at an intensity of 0.1 mW/cm$^2$.

8. The sensor according to claim 1, wherein the black phosphorus flake has a responsivity that falls within a range of $1.6 \times 10^4$ A/W to $1.7 \times 10^4$ A/W when subjected to UV-A irradiation at an intensity of 1 mW/cm$^2$.

9. The sensor according to claim 1, wherein the black phosphorus flake has a responsivity that falls within a range of $7.7 \times 10^4$ A/W to $7.8 \times 10^4$ A/W when subjected to UV-A irradiation at an intensity of 0.1 mW/cm$^2$.

10. The sensor according to claim 7, wherein the sensor substrate is an oxide coated silicon substrate.

11. The sensor according to claim 7, wherein sensor substrate is a polymer substrate.

12. The sensor according to claim 11, wherein the polymer substrate is manufactured from a polymer selected from the group consisting of polyethylene 2,6-naphthalate) (PEN), polyethylene imine (PEI), poly(methyl methacrylate) (PMMA), polyimide (PI), polyethylene terephthalate (PET), and polydimethylsiloxane (PDMS).

13. A method of discriminating between wavelength regions in an electromagnetic spectrum using a sensor, comprising the steps of:
    subjecting a sensing element supported on a surface of a substrate of the sensor according to claim 1 to electromagnetic radiation; and
    detecting a change in photocurrent measured between at least one pair of terminal electrodes formed on the sensor substrate and in electrical contact with the sensing element, as a function of an intensity of the electromagnetic radiation impinging on the sensing element, wherein a positive dependency on the intensity corresponds to a first wavelength region and a negative dependency on the intensity corresponds to a second wavelength region.

14. A method according to claim 13, wherein the first wavelength region corresponds to wavelengths that fall within a range of 315 nm to 400 nm, and the second wavelength region corresponds to wavelengths that fall within a range of 280 nm to 315 nm.

15. A sensing element for use in a sensor for discriminating between wavelength regions in an electromagnetic spectrum, comprising:

at least one black phosphorus flake supported on a surface of a substrate, wherein the black phosphorus flake is responsive to electromagnetic radiation to yield a change in photocurrent measured between at least one pair of terminal electrodes disposed on the sensor substrate and in electrical contact with the sensing element, as a function of an intensity of the electromagnetic radiation impinging on the black phosphorus flake, wherein a positive dependency on the intensity corresponds to a first wavelength region and a negative dependency on the intensity corresponds to a second wavelength region; wherein the black phosphorus flake has a lateral dimension that is greater than 1 μm.

* * * * *